United States Patent
Paniccia et al.

(10) Patent No.: US 11,199,407 B2
(45) Date of Patent: *Dec. 14, 2021

(54) SYSTEM ARCHITECTURE FOR INTEGRATED PHOTONICS OPTICAL GYROSCOPES

(71) Applicant: Anello Photonics, Inc., Santa Clara, CA (US)

(72) Inventors: Mario Paniccia, Santa Clara, CA (US); Qing Tan, Santa Clara, CA (US)

(73) Assignee: Anello Photonics, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/983,867

(22) Filed: Aug. 3, 2020

(65) Prior Publication Data
US 2021/0010811 A1    Jan. 14, 2021

Related U.S. Application Data

(63) Continuation of application No. 16/659,424, filed on Oct. 21, 2019, now Pat. No. 10,731,988.
(Continued)

(51) Int. Cl.
*G01C 19/72* (2006.01)
*G02B 6/12* (2006.01)

(52) U.S. Cl.
CPC ......... *G01C 19/727* (2013.01); *G01C 19/721* (2013.01); *G02B 6/12019* (2013.01);
(Continued)

(58) Field of Classification Search
CPC .... G01C 19/727; G01C 19/72; G01C 19/721; G01C 19/722; G01C 19/725;
(Continued)

(56) References Cited

U.S. PATENT DOCUMENTS

| 4,991,926 A | 2/1991 | Pavlath |
| 5,194,917 A * | 3/1993 | Regener ............... G01C 19/722 356/460 |

(Continued)

OTHER PUBLICATIONS

Spencer et al., Integrated waveguide coupled Si3N4 resonators in the ultrahigh-Q regime, Optical Society of America, Sep. 8, 2014, 153-157 pages, vol. 1 No. 3.
(Continued)

*Primary Examiner* — Tarifur R Chowdhury
*Assistant Examiner* — Jonathon Cook
(74) *Attorney, Agent, or Firm* — Lowenstein Sandler LLP; Madhumita Datta

(57) ABSTRACT

The present disclosure relates to system-level integration of lasers, electronics, integrated photonics-based optical components and a sensing chip. Novel waveguide design on the integrated photonics chip, acting as a front-end chip, ensures precise detection of phase change in a fiber coil or a sensing chip having a waveguide coil or ring resonator, where the sending chip is coupled to the front end chip. Strip waveguides are designed to primarily select TE mode over TM mode when laser light is coupled into the integrated photonics chip. A plurality of mode-selective filters, based on multi-mode interference (MMI) filter, a serpentine structure, or other types of waveguide-based mode-selective structure, are introduced in the system architecture. Additionally, implant regions are introduced around the waveguides and other optical components to block unwanted/stray light into the waveguides and optical signal leaking out of the waveguide.

22 Claims, 23 Drawing Sheets

Related U.S. Application Data

(60) Provisional application No. 62/904,443, filed on Sep. 23, 2019, provisional application No. 62/872,640, filed on Jul. 10, 2019.

(52) U.S. Cl.
CPC ............. *G02B 2006/12109* (2013.01); *G02B 2006/12142* (2013.01)

(58) Field of Classification Search
CPC ...... G02B 6/12019; G02B 2006/12109; G02B 2006/12142; G01B 2290/70
See application file for complete search history.

(56) References Cited

U.S. PATENT DOCUMENTS

| | | | | |
|---|---|---|---|---|
| 5,377,008 | A * | 12/1994 | Ridgway | G01N 21/45 356/128 |
| 5,377,283 | A * | 12/1994 | Blake | G01C 19/721 385/11 |
| 6,108,478 | A * | 8/2000 | Harpin | G02B 6/1228 385/129 |
| 6,163,632 | A | 12/2000 | Rickman et al. | |
| 7,106,448 | B1 | 9/2006 | Vawter et al. | |
| 7,379,633 | B1 | 5/2008 | Ashley | |
| 9,389,081 | B1 | 7/2016 | Strandjord et al. | |
| 9,562,768 | B2 | 2/2017 | Safar | |
| 10,274,319 | B2 | 4/2019 | Wang | |
| 10,429,677 | B2 | 10/2019 | Puckett et al. | |
| 2004/0091207 | A1 | 5/2004 | Ohno | |
| 2010/0301352 | A1 * | 12/2010 | Strandjord | G01C 25/00 257/84 |
| 2015/0021442 | A1 | 6/2015 | Taylor | |
| 2015/0214425 | A1 | 7/2015 | Taylor | |
| 2016/0363446 | A1 * | 12/2016 | Lefevre | G01C 19/722 |
| 2018/0081112 | A1 | 3/2018 | Puckett et al. | |
| 2018/0081205 | A1 | 3/2018 | Puckett | |
| 2018/0274926 | A1 | 9/2018 | Wang | |
| 2019/0101392 | A1 | 4/2019 | Bischel et al. | |
| 2019/0258004 | A1 | 8/2019 | Puckett | |

OTHER PUBLICATIONS

Spencer et al., Integrated single and multi-layer Si3N4 platform for ultralow loss propagation and small bending radii, Optical Society of America 2014, 1-3 pages.

Demis et al., Multilayer Platform for Ultra-Low-Loss Waveguide Applications, IEEE Photonics Technology Letters, Jun. 1, 2012, 876-878 pages, vol. 24, No. 11.

Gundavarapu et al., Interferometric Optical Gyroscope Based on an Integrated Si3N4 Low-Loss Waveguide Coil, Journal of Lightwave Technology, IEEE, Feb. 15, 2018, 1-7 pages, vol. 36, No. 4.

Vasan et al., Design of integrated hybrid silicon waveguide optical gyroscope, Optical Society of America, Oct. 7, 2014, 1-6 pages, vol. 22, No. 21.

Chamoun et al., Aircraft-navigation-grade laser-driven FOG with Gaussian-noise phase modulation, Optics Letters, Apr. 11, 2017, 1600-1603 pages, vol. 42, No. 8.

Chamoun et al., Pseudo-random-bit-sequence phase modulation for reduced errors in a fiber optic gyroscope, Optics Letters, Dec. 5, 2016, 5664-5667 pages, vol. 41, No. 24.

Komljenovic et al., Frequency modulated lasers for interferometric optical gyroscopes, Optics Letters, Apr. 6, 2016, 1773-1776 pages, vol. 41, No. 8.

Wang et al., Low-cost, High-end Tactical-grade Fiber Optic Gyroscope Based on Photonic Integrated Circuit, IEEE, 2019, 1-2 pages.

TM-Mode Selective Filter Using Leaky Waveguide Structure, Electronics and Communications in Japan, Part 2, vol. 85, No. 8, 2002, Ohke et al (Year 2002).

A Versatile Silicon-Silicon Nitride Photonics Platform for Enhanced Functionalities and Applications, Appl. Sci. 2019, 9, 255; doi:10.3390/app9020255 Wilmart et al (Year: 2019).

Sensing Rotation with Light: From Fiber Optic Gyroscope to Exceptional Points, Nov. 7-8, 2018 Stanford's 2018 PNT Symposium, Michel Digonnet (Year: 2018).

PCT International Search Report and Written Opinion for International Application No. PCT/US2020/039915 dated Feb. 24, 2021, 20 pages.

Ohke et al. TM-Mode Selective Filter Using Leaky Waveguide Structure. Electronics and Communications in Japan, Pan. 2, vol. 85, No. 8, 2002, pp. 9-15.

\* cited by examiner

SYSTEM ARCHITECTURE FOR INTEGRATED PHOTONICS OPTICAL GYROSCOPES

RELATED APPLICATIONS

This application is a continuation of U.S. patent application Ser. No. 16/659,424, filed Oct. 21, 2019, titled "System Architecture for Silicon Photonics Optical Gyroscopes," which claims the benefit of U.S. Provisional Patent Application Nos. 62/904,443, filed Sep. 23, 2019, titled, "System Architecture for Silicon Photonics Optical Gyroscopes with Mode-Selective Waveguides," and 62/872,640, filed Jul. 10, 2019, titled "System Architecture for Silicon Photonics Optical Gyroscopes," the entireties of which are incorporated herein by reference.

TECHNICAL FIELD

The present disclosure relates to system-level integration of integrated photonics-based optical gyroscopes.

BACKGROUND

Gyroscopes (sometimes also referred to as "gyros") are devices that are able to sense angular velocity. Gyroscopes can be mechanical or optical, and vary in precision, performance cost and size. The applications include, but are not limited to, military, aircraft navigation, robotics, autonomous vehicles, virtual reality, augmented reality, gaming etc. Optical gyroscopes typically have the highest performance and are based on interferometric measurements and the Sagnac effect (a phenomenon encountered in interferometry that is elicited by rotation). Since optical gyroscopes do not have any moving parts, they have advantages over mechanical gyroscopes as they can withstand effects of shock, vibration and temperature variation better than the mechanical gyroscopes with moving parts. The most common optical gyroscope is the fiber optical gyroscope (FOG). Construction of a FOG typically involves a long loop (or a coil comprising several loops) of polarization-maintaining (PM) fiber. Laser light is launched into both ends of the PM fiber traveling in different directions. If the fiber coil is moving, the optical beams experience different optical path lengths with respect to each other. By setting up an interferometric system, one can measure the small path length difference that is proportional to the area of the enclosed loop and the angular velocity of the rotating coil.

Phase signal of an optical gyro is proportional to the Sagnac effect times the angular rotation velocity, as shown in the following equation:

$$\Delta\phi = (8\pi NA/\lambda c)\Omega$$

where, N=number of turns in the gyro,
A=area enclosed
$\Omega$=angular rotation velocity
$\Delta\phi$=optical phase difference signal
$\lambda$=wavelength of light
c=speed of light These FOG's can have very high precision, but at the same time, they are of large dimension, are very expensive, and are hard to assemble due to the devices being built based on discrete optical components that need to be aligned precisely. Often, manual alignment is involved, which is hard to scale up for volume production.

SUMMARY

Disclosed herein are system components and methods to produce a small-footprint integrated photonics optical gyroscope. Integrated photonics optical gyroscopes may be based on silicon photonics, which are abbreviated as SiPhOG™ (Silicon Photonics Optical Gyroscope), though compound semiconductor (III-V semiconductor) based integrated photonics optical gyroscopes are also within the scope of this disclosure. Furthermore, some embodiments of the integrated photonics optical gyroscopes may have a combination of silicon photonics and III-V semiconductor based photonics components. The inventors design an integrated photonics chip with higher-level system architecture and key performance parameters in mind, including, but not limited to laser performance, tuning parameters, detector parameters, as well as packaging considerations.

The key to fiber-based optical gyroscope's performance is the long length of high quality, low loss, optical fiber that is used to measure the Sagnac effect. The present inventors recognize that with the advent of integrated photonics suitable for wafer scale processing, there is an opportunity to replace FOGs with smaller integrated photonic chip solutions without sacrificing performance. Photonics based optical gyros have reduced size, weight, power and cost, but in addition can be mass produced in high volume, are immune to vibration and have the potential to offer performances equivalent to FOGs.

One key element of this integrated photonic solution is to couple an integrated photonics chip with integrated photonic components thereon to a waveguide chip that replaces the long length of a polarization-maintaining (PM) optical fiber coil containing very low loss waveguides. The integrated photonics chip as well as the waveguide chip can be manufactured using wafer scale processes.

The solution disclosed herein involves low-loss waveguide coils (patterned in the shape of a spiral, which may be circular or any other geometry suitable for volume manufacturing) or rings. Either of these WG coil designs may be on a same plane or may be distributed among a plurality of vertical planes to increase the length of the optical path while avoiding the increased loss caused by intersecting waveguides in the state-of-the-art designs. The waveguide design and manufacture techniques are described in co-pending U.S. provisional application No. 62/858,588, filed Jun. 7, 2019.

A laser source of suitable wavelength (which may deviate from 1550 nm for optical gyroscope applications to achieve optimum waveguide loss) may be fiber-coupled to the integrated photonics chip. The receiving end of the waveguide on the integrated photonics chip may be tapered (i.e. flared to match the size of the core of a single-mode fiber, which is typically 8-10 μm). The waveguide on the integrated photonics chip is polarization maintaining (e.g., TE polarized), which may be achieved by suitable design of the waveguide. For example, strip waveguides are designed to primarily select TE mode over TM mode when laser light is coupled into the integrated photonics chip. A plurality of mode-selective filters, which may be based on multi-mode interference (MMI) filter or a serpentine structure, or other integrated device structure (such as integrated metal lines, altering waveguide dimensions etc.), are introduced in the system architecture. Additionally, implant regions are introduced around the waveguides and other optical components to block unwanted/stray light into the waveguides and optical signal leaking out of the waveguide.

On-chip detectors on the integrated photonics chip can be p-i-n photodetectors or avalanche photodiodes (APDs) that convert light to electrical signal. The detectors are used for measuring the Sagnac effect, for testing as well as power monitoring.

Various types of integrated photonics chips may be fabricated to test the performance of the optical gyroscope. The different designs may have additional components added or removed for testing purposes, e.g., for packaging experiments, testing and or assembly. Various designs may be accommodated in a multi-project wafer (MPW).

Specifically, aspects of the disclosure includes, An integrated photonics-based front-end chip for coupling light into and out of an optical gyroscope component, the front-end chip comprising: a laser source producing light, wherein the laser source comprises one or more semiconductor lasers; control electronics for the laser source; an input coupler that couples the light from the laser source into an integrated photonics waveguide structure that propagates the coupled light in the form of a guided optical beam towards the optical gyroscope component; a first optical mode-selective filter integrated with the integrated photonics waveguide structure to select a preferred optical mode of the guided optical beam; at least one optical splitter in the path of the guided optical beam to produce a first branch and a second branch of the guided optical beam; a phase modulator that modulates optical phases of the first branch and the second branch of the guided optical beam relative to each other; a first output coupler that couples the first branch of the guided optical beam with a first end of a gyroscope waveguide structure on the optical gyroscope component; a second output coupler that couples the second branch of the guided optical beam with a second end of the gyroscope waveguide structure on the optical gyroscope component; and, an optical detector coupled with the at least one optical splitter, wherein the optical detector receives an optical signal representing an optical phase difference in the return paths of the first branch and second branch of the guided optical beam after traveling within the gyroscope waveguide structure on the optical gyroscope component and after being coupled back to the integrated photonics waveguide structure via the first output coupler and the second output coupler.

BRIEF DESCRIPTION OF THE DRAWINGS

The present disclosure will be understood more fully from the detailed description given below and from the accompanying drawings of various implementations of the disclosure. Please note that the dimensions shown in the figures are for illustrative purposes only and not drawn to scale.

FIG. 5B(II) illustrates leakage of light into the slab portion of the rib waveguide in straight sections of the waveguide.

DETAILED DESCRIPTION

Aspects of the present disclosure are directed to integration of compact ultra-low loss waveguide chips with other system-level integrated photonics components for optical gyroscope applications. The system integration is done with large scale manufacturing in mind to facilitate mass production of integrated photonics optical gyroscopes.

Figure 1:
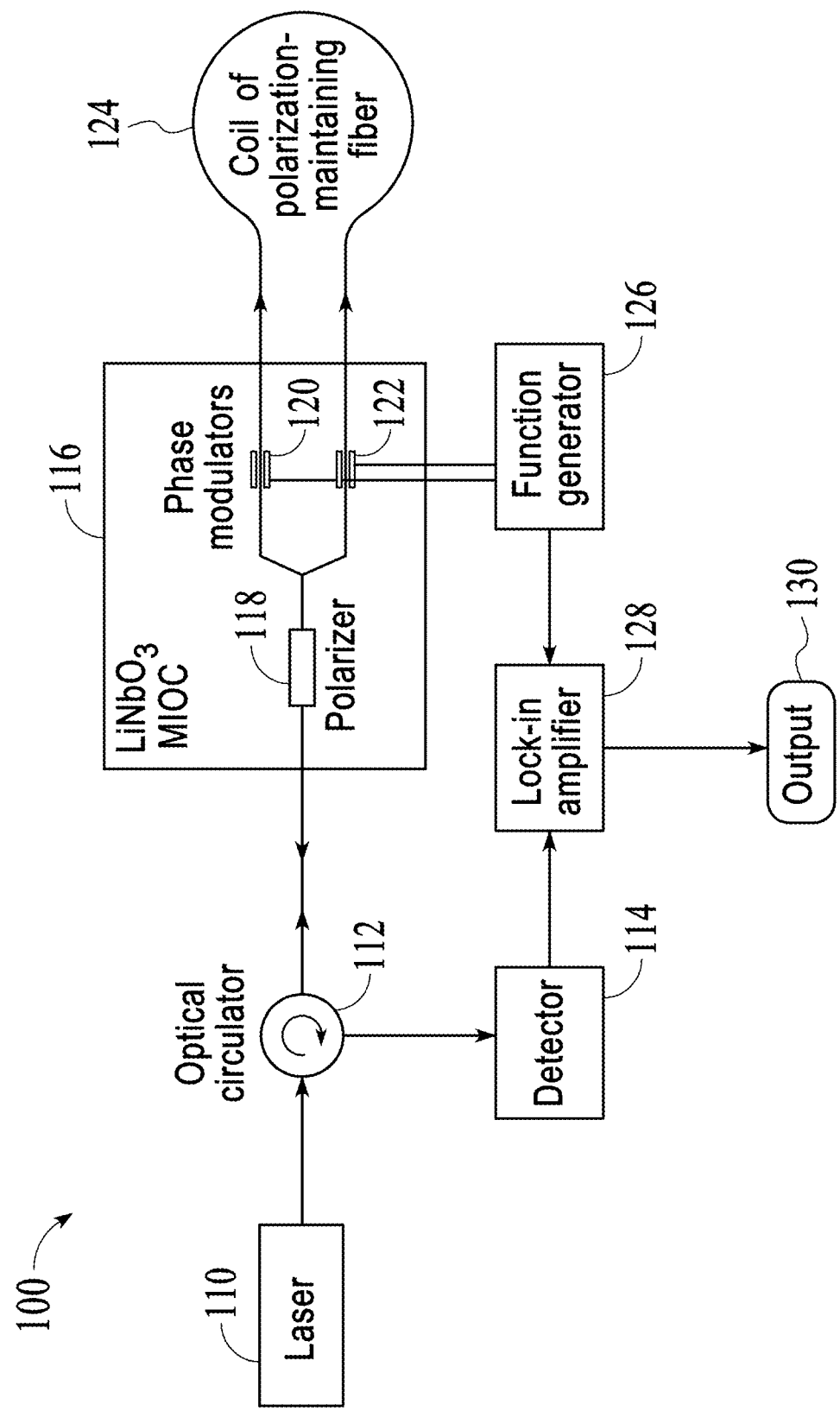
FIG. 1 illustrates a high-level architecture for a typical fiber optical gyroscope based on Sagnac effect.

FIG. 1 illustrates a high-level architecture 100 for a typical fiber optical gyroscope based on Sagnac effect. The architecture involves a laser source 110 sending optical signal to a polarization-maintaining (PM) fiber coil 124 via intermediate system components. The intermediate system components include an optical isolator 112, a polarizer 118, and phase modulators 120 and 122. The polarizer 118 and phase modulators 120 and 122 may be part of a lithium niobate ($LiNbO_3$) multi-functional integrated optical chip (MIOC) 116. Also, even if for clarity, the fiber coil 124 is shown to have just one loop, in actual devices, there may be a plurality of turns, depending on the length of fiber required to take advantage of the Sagnac effect. The phase modulators 120 and 122 may be along two branches of a 50/50 splitter within the MIOC 116. Light going in one direction sees a different (shorter or longer) path length than light going in the opposite direction, creating measurable phase shift due to Sagnac effect. The phase modulators may be electrically driven by a function generator 126 (e.g., a sine or square wave generator).

Signal from the function generator 126 is sent to a lock-in amplifier 128, which also receives signal from a photodetector 114 which receives directional optical signal from the circulator 112. The output 130 represents the phase shift in the gyroscope due to Sagnac effect caused by the difference in optical path length.

Figure 2:
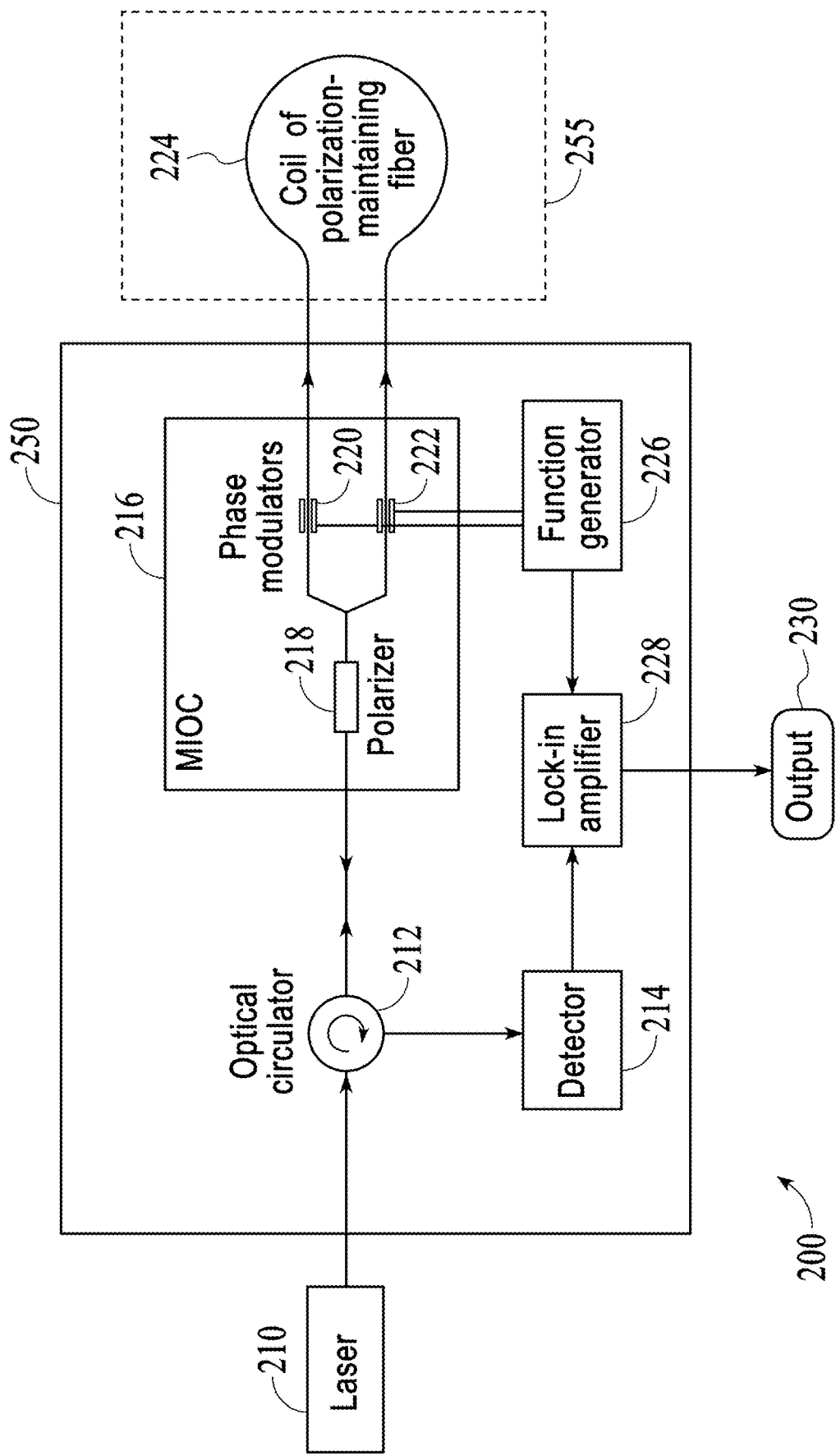
FIG. 2 illustrates a high-level architecture for a fiber optical gyroscope where at least some components at the front end are replaced with an integrated photonics chip.

FIG. 2 illustrates a high-level architecture 200 for a fiber optical gyroscope where at least some components of the front end of a conventional architecture (e.g., what is shown in FIG. 1) are replaced with integrated photonics components. Components 212, 214, 216, 218, 220, 222, 226 and 228 are functionally equivalent to the corresponding components 112, 114, 116, 118, 120, 122, 126 and 128 described in FIG. 1. However, many of the components within the modified front end 250 can be fabricated using standard semiconductor manufacturing. For example, the components on the MIOC 216 may comprise all integrated photonics components. The laser source 210 and the fiber coil 224 may be outside of the modified front end 250, though further integration is possible, as described below. The fiber coil 224 constitutes the sensing portion 255 in the architecture 200, and in embodiments described below, the fiber coil may be replaced by a waveguide chip acting as the sensing portion 255. The output 230 is the measured phase shift due to optical path length difference. In addition, electronics may be integrated on chip, for example, as shown with respect to the illustrative embodiment in FIG. 3B below.

Figure 3A:
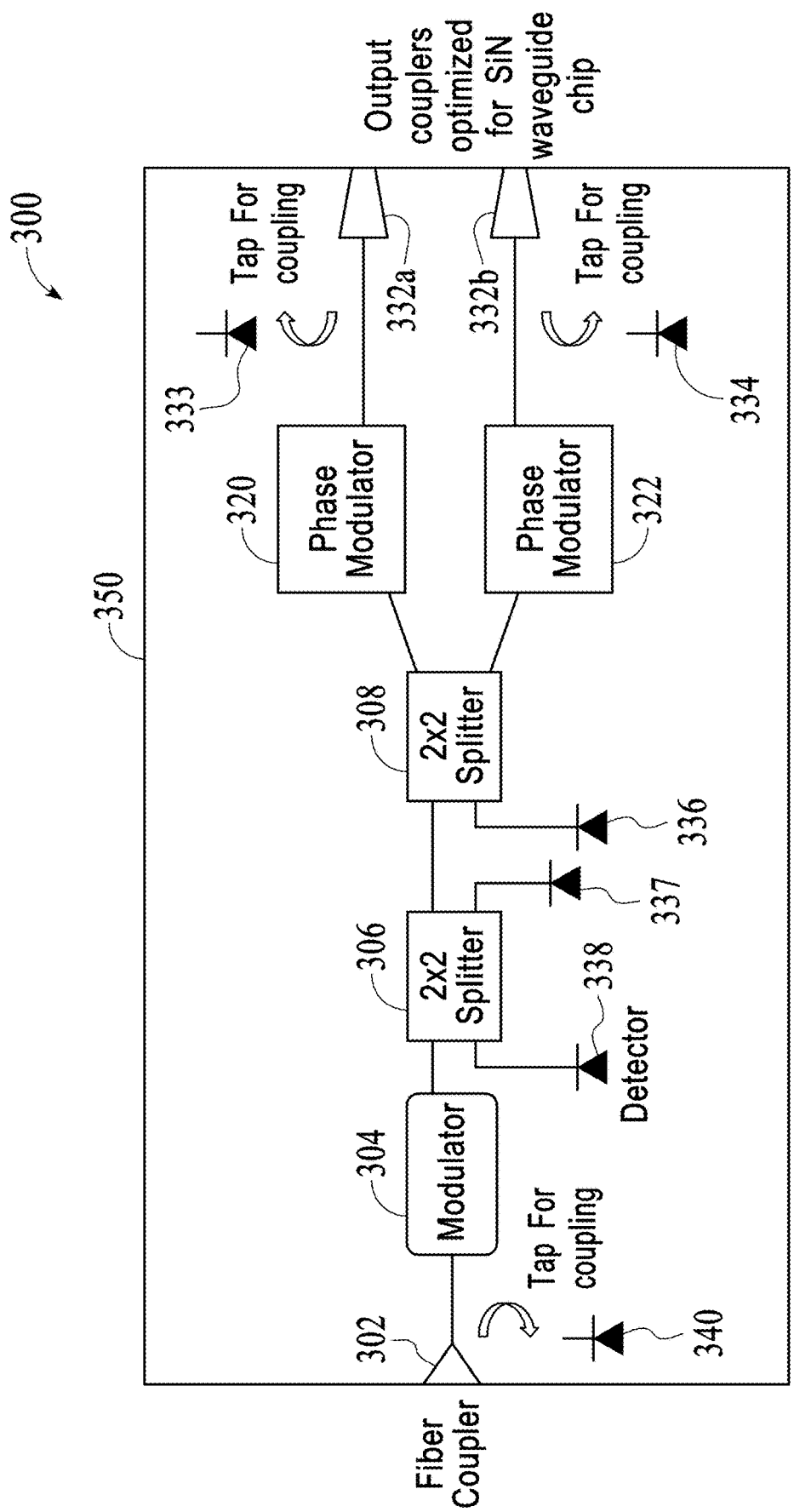
FIG. 3A is a schematic of one embodiment of an integrated photonics based front end that couples to a SiN waveguide chip.

FIG. 3A is a schematic of one embodiment 300 of an integrated photonics chip 350 that couples to a fiber coil, or a waveguide chip (not shown) that can replace the fiber coil in FIGS. 1 and 2. The integrated photonics chip in embodiment 300 coupled with the waveguide chip constitute a gyroscope (e.g., a SiPhOG when silicon photonics is used) which may be part of an inertial measurement unit (IMU) package. Note that IMU may have other components, such as accelerometers, in addition to the integrated photonics optical gyroscope. Therefore, making the integrated photonics optical gyroscope part compact reduces the overall size, weight power and cost of the IMU. This weight reduction can be crucial for certain applications, for example, light-weight unmanned aerial vehicles. IMU may be a needed technology component a for more establishing sensing technologies for autonomous vehicles, such as LiDAR (Light Detection and Ranging), radar and cameras that will be used in future generation of autonomous vehicles.

In the waveguide chip (also referred to as the "gyro chip" or "sensing chip"), low-loss waveguide core may be made of silicon nitride ($Si_3N_4$), and the waveguide cladding may be made of fused silica or oxide. This waveguide structure is also referred to simply as SiN waveguide, and a chip containing the SiN waveguide is referred to as a SiN waveguide chip in the figures.

Figure 10:
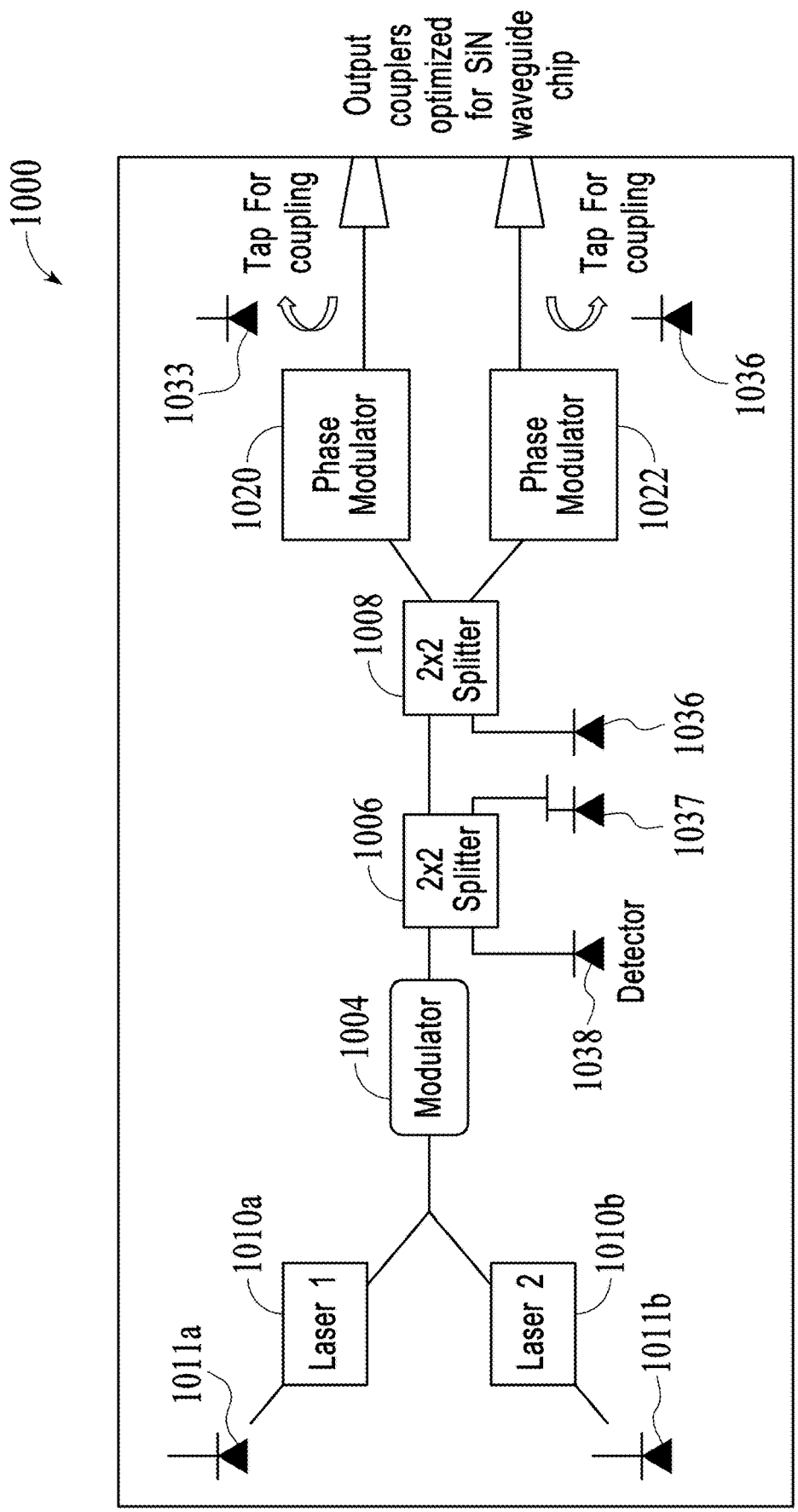
FIG. 10 is a schematic of an integrated photonics chip where optical signals from two lasers are combined.

Referring back to FIG. 3A, the laser source (not shown) is coupled to the integrated photonics chip 350 via a fiber, which may be a single-mode (SM) fiber. The core size of a SM fiber is typically in the 8-10 µm range. An input waveguide on the integrated photonics chip 350 may have to be designed with a flared end for efficient coupling with the SM fiber carrying the optical signal from the laser source to the integrated photonics chip. Note that instead of fiber-coupling, laser light may be butt-coupled to the integrated photonics chip. Though the element 302 is labeled as a fiber coupler in the illustrative figures, it is generically an input coupler, as claimed. An optical tap (e.g., a tap that may take out 0.5-1% of optical power) may send part of the optical signal to a detector 340 to measure the coupling efficiency between the laser source and the integrated photonics chip. Optionally, an optical phase modulator 304 may be inserted in the optical path that eventually leads to an optical splitter, e.g., 2×2 optical splitters 306 and 308. Note that some embodiments may have two 2×2 splitters, some other embodiments may have an Y-splitter, and yet other embodiments may have a 2×2 splitter and a Y-splitter. Also note that the laser source may be on-chip, as shown in FIG. 10 either by direct attach or can be III-V bonded or epitaxially grown or grown using Quantum Dot technology on the front-end chip substrate. The optical phase modulator 304 may spread the linewidth of the laser source, as described further below.

Figure 13:
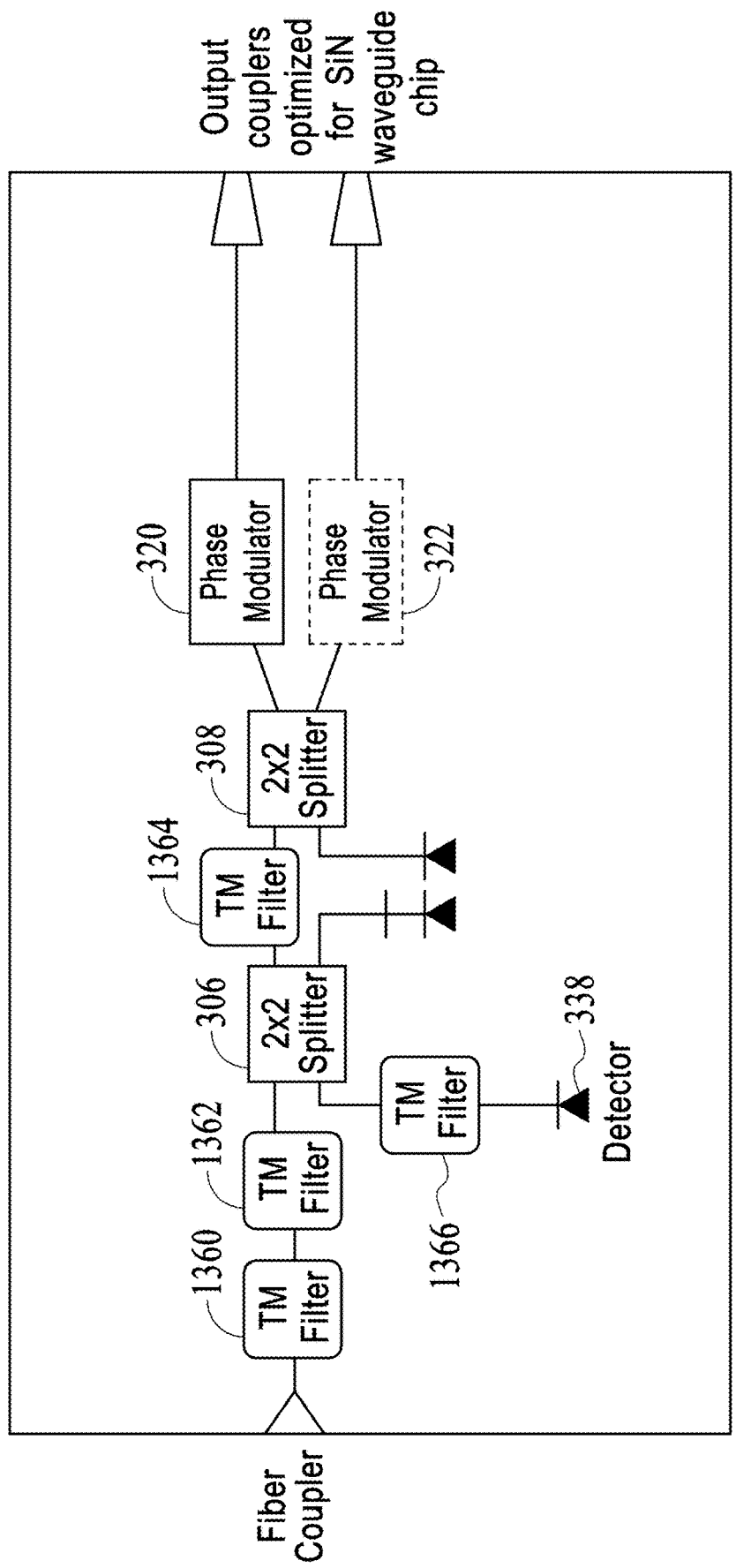
FIG. 13 shows some example location of TM filters on the integrated photonics chip.

The splitters and/or directional couplers are designed on-chip in the embodiment shown in FIG. 3A to emulate circulator (as in FIGS. 1 and 2) for optimized light back into the detector 338 (may be referred to as Sagnac detector—this is the key detector in the integrated photonics chip 350) for phase measurement. Also, electrical (p-n junction based) or other type of phase modulators may be incorporated in one or both of the two branches of the waveguide leading to output couplers 332a and 332b that are optimized for coupling out to the SiN waveguide chip. For example, thermal phase modulators may have lower insertion loss compared to other types of phase shifters, and are easy to integrate with the waveguides. The phase modulators may operate in a push-pull configuration to enhance the efficacy of the Sagnac effect. For push-pull operation, phase modulators are included in both output waveguide branches. However, in some embodiments, only one branch of the output waveguide has a phase modulator, i.e. one of the modulators 320 or 322 may not be present, or may not be used. For example, FIG. 5D shows that just one branch of a waveguide has a phase modulator. FIG. 13 shows that even though a phase modulator 322 is included (dashed line) for optional use in the push-pull mode, optical beam in only one branch can be modulated. Also note that though the word "output" is used to describe the waveguides branches and output couplers 332a and 332b, the same structures receive the return optical beams as input from the SiN chip once the beams have traveled through the sending coil or optical resonator in the SiN chip.

A non-limiting illustrative dimension of the SiN waveguide in the gyro chip is a height (i.e. thickness of the patterned waveguide core layer) of 90 nm and a lateral width of 2.8 µm. Persons skilled in the art would appreciate that these illustrative dimensional values mentioned in the specification are not limiting to the scope of the disclosure. To lower waveguide loss, it may be beneficial to have symmetric upper and lower claddings around the SiN core. This structure may be obtained via wafer bonding of fused silica wafers or other suitable materials such as oxide. The thickness of the waveguide SiN layer may vary between 60-90 nm and the width may vary between 2-5 µm depending on the desired optical mode. The design of the output couplers 332a and 332b varies based on waveguide dimensions on the SiN waveguide chip. Output spacing and/or optimal placement of couplers 332a and 332b on the photonics chip can be determined using simulation before fabricating the integrated photonics chip 350. SiN waveguides on fused silica platform are described in co-pending provisional applications 62/858,599 filed on Jun. 7, 2019, titled, "Integrated Silicon Photonics Optical Gyroscope on Fused Silica Platform," and 62/896,365 filed on Sep. 5, 2019, titled "Single-layer and Multi-layer Structures for Integrated Silicon Photonics Optical Gyroscopes."

In addition to the Sagnac detector 338, additional detectors 333, 334, 336 and 337 may be incorporated to measure (for testing and/or monitoring) propagation and coupling losses at various places along the integrated photonics chip as well as to measure coupling efficiency between the integrated photonics chip and the SiN waveguide chip. For example, detectors 333 and 334 may be coupled to optical taps (e.g., 0.5-1% of the optical power is tapped) that measure coupling efficiency at the output couplers 332a and 332b. The detectors can be p-i-n photodetectors (PIN diodes) that convert light to electrical signal. The detectors can also be avalanche photodiodes (APDs). One of the advantages of using APDs is the gain achievable at the detector reduces the need to increase the laser power. Note that all of the detectors 333, 334, 336 and 337 may not be used in all embodiments. Also, some detectors on the test chip masks may be taken away from the product mask once the chip design is optimized and chip performance is optimized, requiring less number of detectors for monitoring.

Figure 3B:
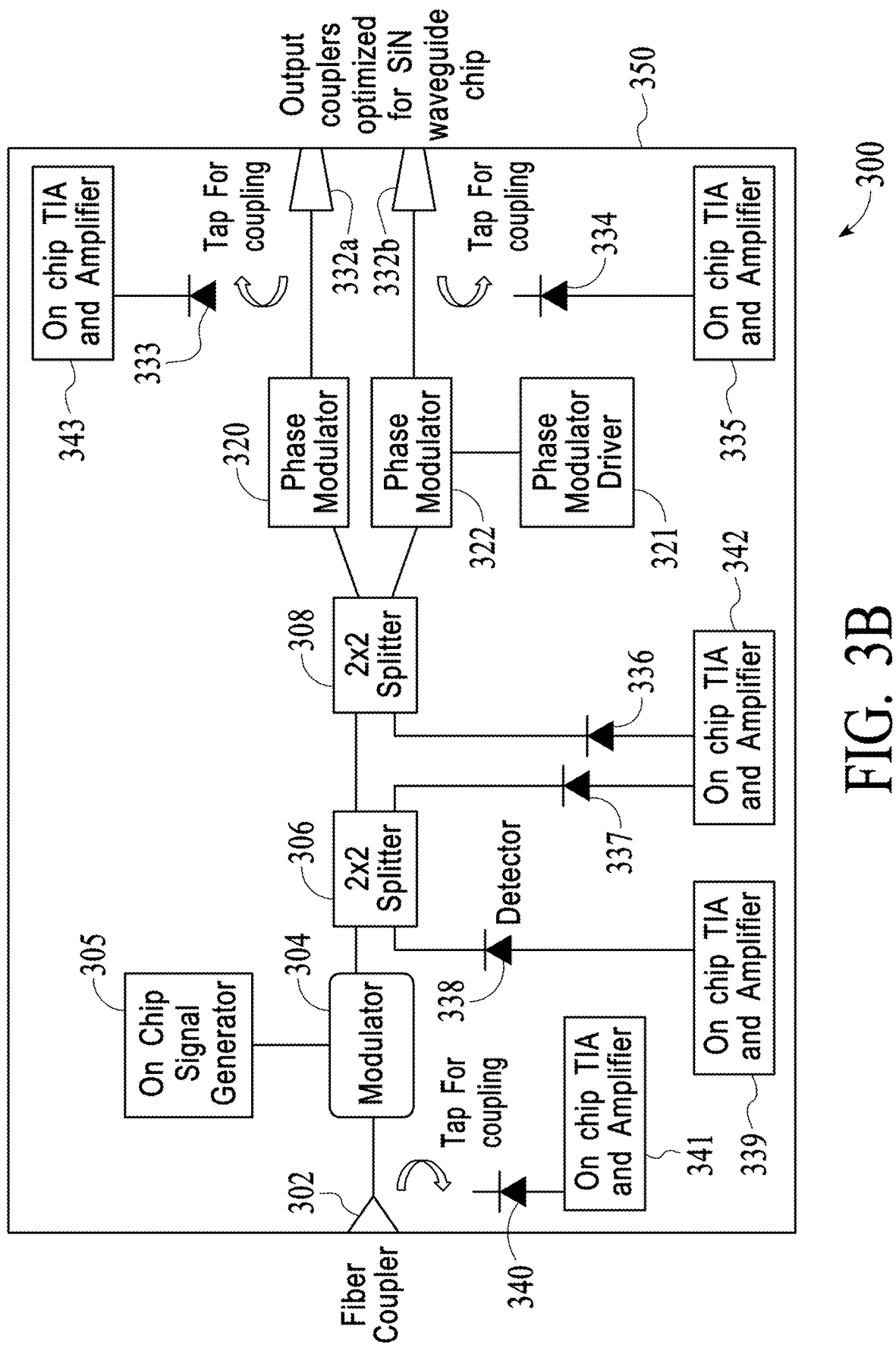
FIG. 3B is a schematic of the embodiment shown in FIG. 3A with additional electronic components on-chip.

FIG. 3B shows various electronics integrated on the integrated photonics chip 350. For example, an on-chip signal generator 305 may be coupled to the phase modulator 304. On-chip trans-impedance amplifier (TIA) and/or other types of amplifiers to boost detected signal may be integrated on-chip as well, as shown with components 341, 339, 342, 343 and 335, coupled to the corresponding detectors. Additionally, a phase modulator driver 321 may de integrated on-chip to impart optical phase difference between the two output waveguide branches. Integrating electronics with photonics in some cases improves performance and reduces noise and provides feedback controls. Although not shown in FIG. 3B, laser power monitoring detectors and corresponding electronics may be part of an integrated photonics chip.

Figure 3C:
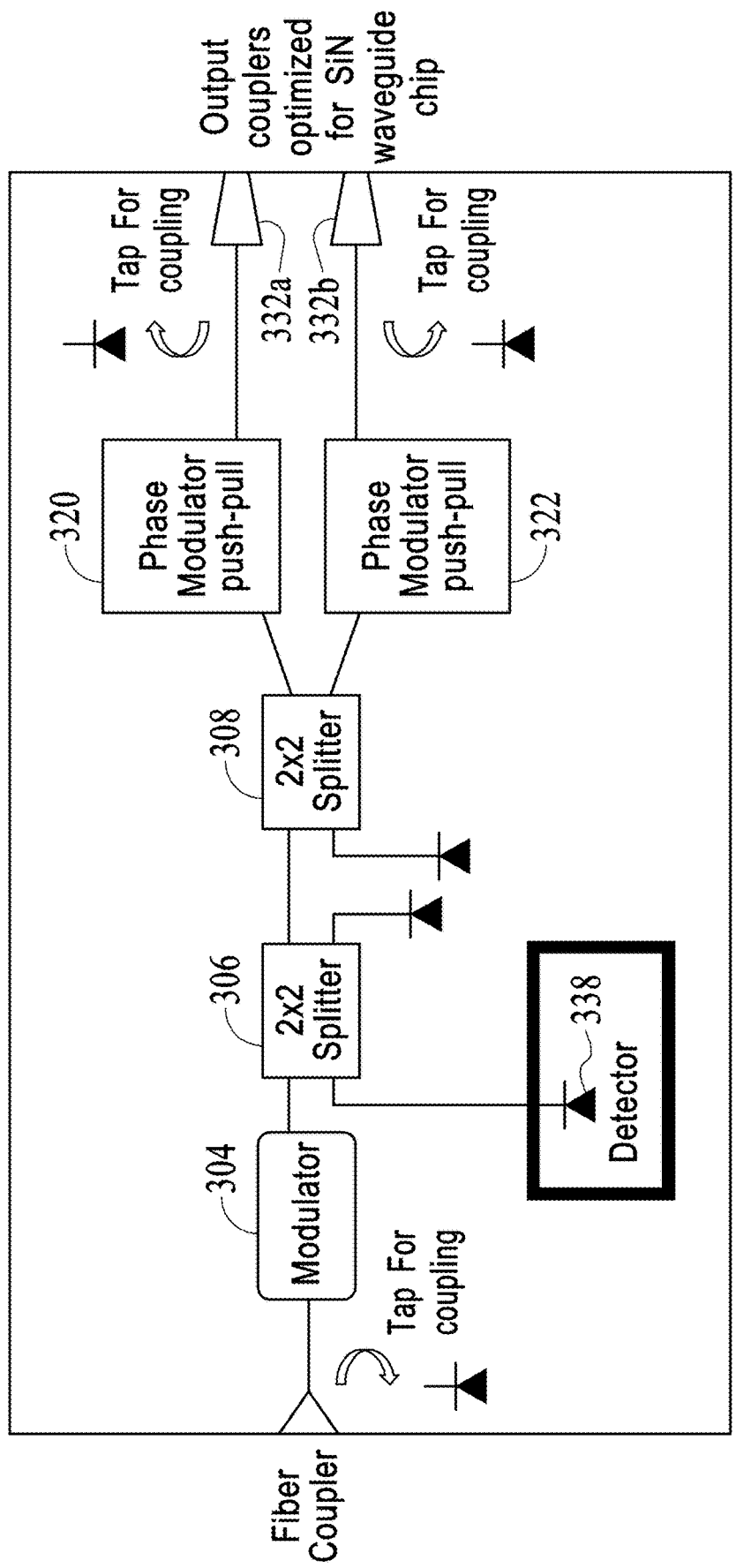
FIG. 3C is a schematic of the embodiment shown in FIG. 3A with deep implant around key detector that is used to measure the Sagnac effect.

FIG. 3C shows that a deep implant (shown as the thick rectangle) around the Sagnac detector 338 is key to avoid any optical signals leaking or scattering in from the integrated photonic chip into the Sagnac phase difference signal that is being measured by the detector 338. More details about the use of implant to avoid light leakage is described with respect to FIGS. 5B-5E.

Figure 4:
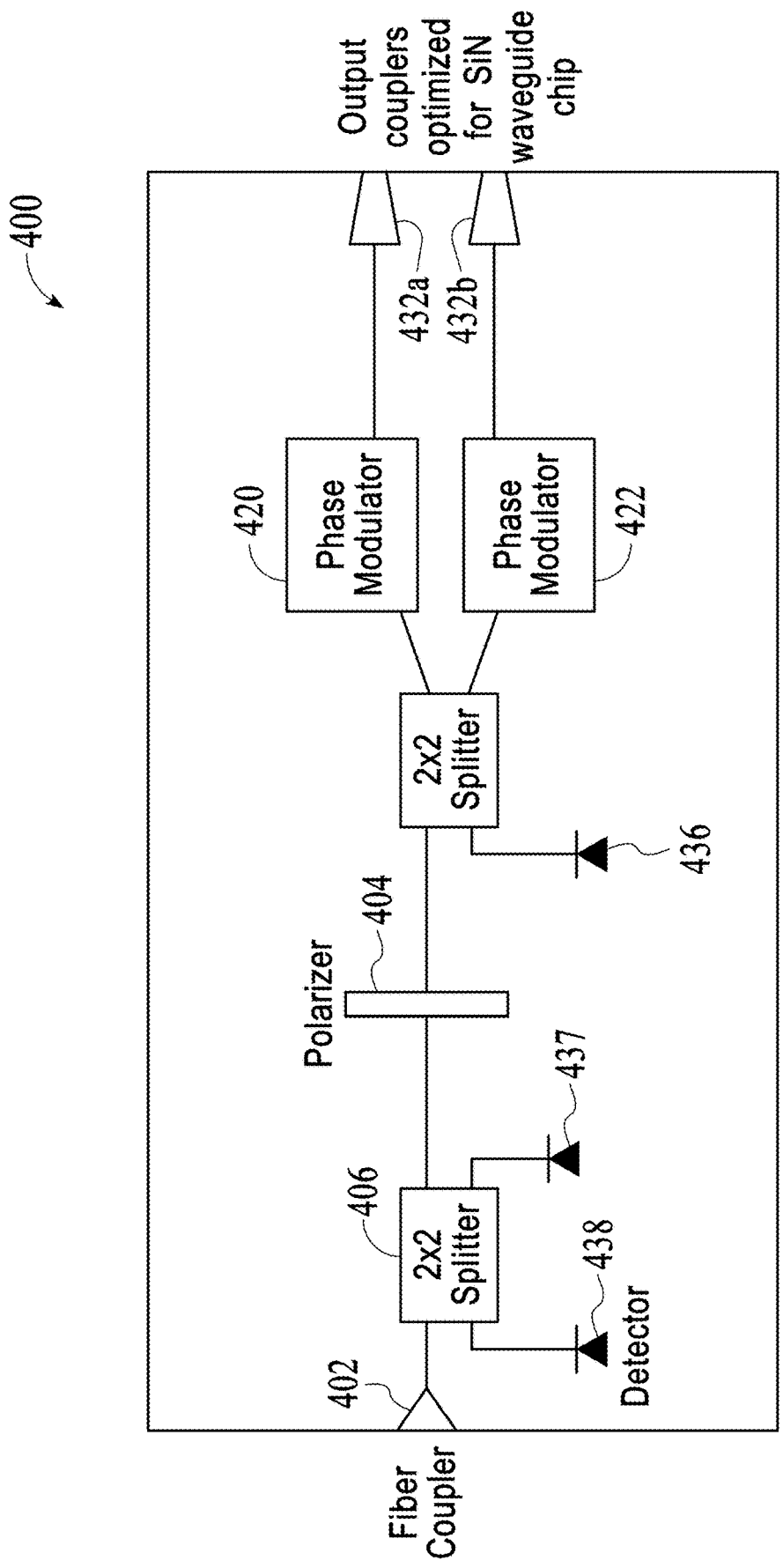
FIG. 4 is a schematic of another embodiment of an integrated photonics chip with an optional polarizer or optical mode selective filter.

FIG. 4 is a schematic of an alternative embodiment 400 of an integrated photonics chip that couples to a SiN waveguide chip, where the optical path includes a polarizer 404 or optical mode selective filter. Other components in embodiment 400, such as 402, 406, 408, 420, 422, 432a, 432b, 436 and 438 are functionally equivalent to the corresponding components 302, 306, 308, 320, 322, 332a, 332b, 336 and 338 shown and described with respect to FIG. 3A.

Figure 5A:
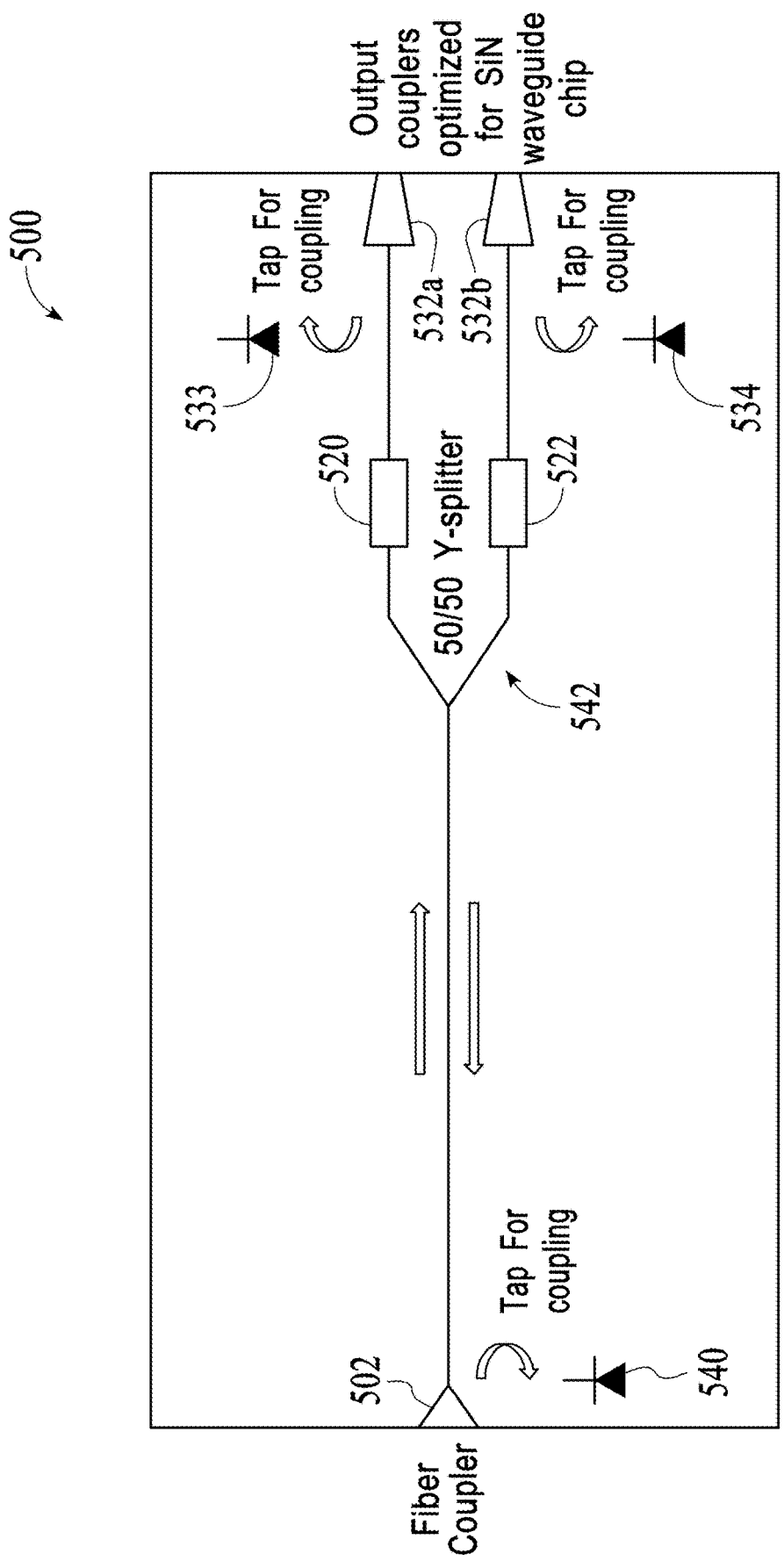
FIG. 5A is schematic of yet another embodiment of an integrated photonics chip that couples to a SiN waveguide chip, wherein the integrated photonics chip is designed to facilitate packaging.

FIG. 5A is schematic of yet another embodiment 500 of an integrated photonics chip that couples to a SiN waveguide chip, wherein the integrated photonics chip is designed to facilitate packaging. In this design, instead of 2×2 splitter(s), a Y-splitter 542 is incorporated. Note that the Y-splitter should be as close to 50-50 as possible. The embodiment shown in FIG. 5A may be used for customized testing purposes.

Figure 5B:
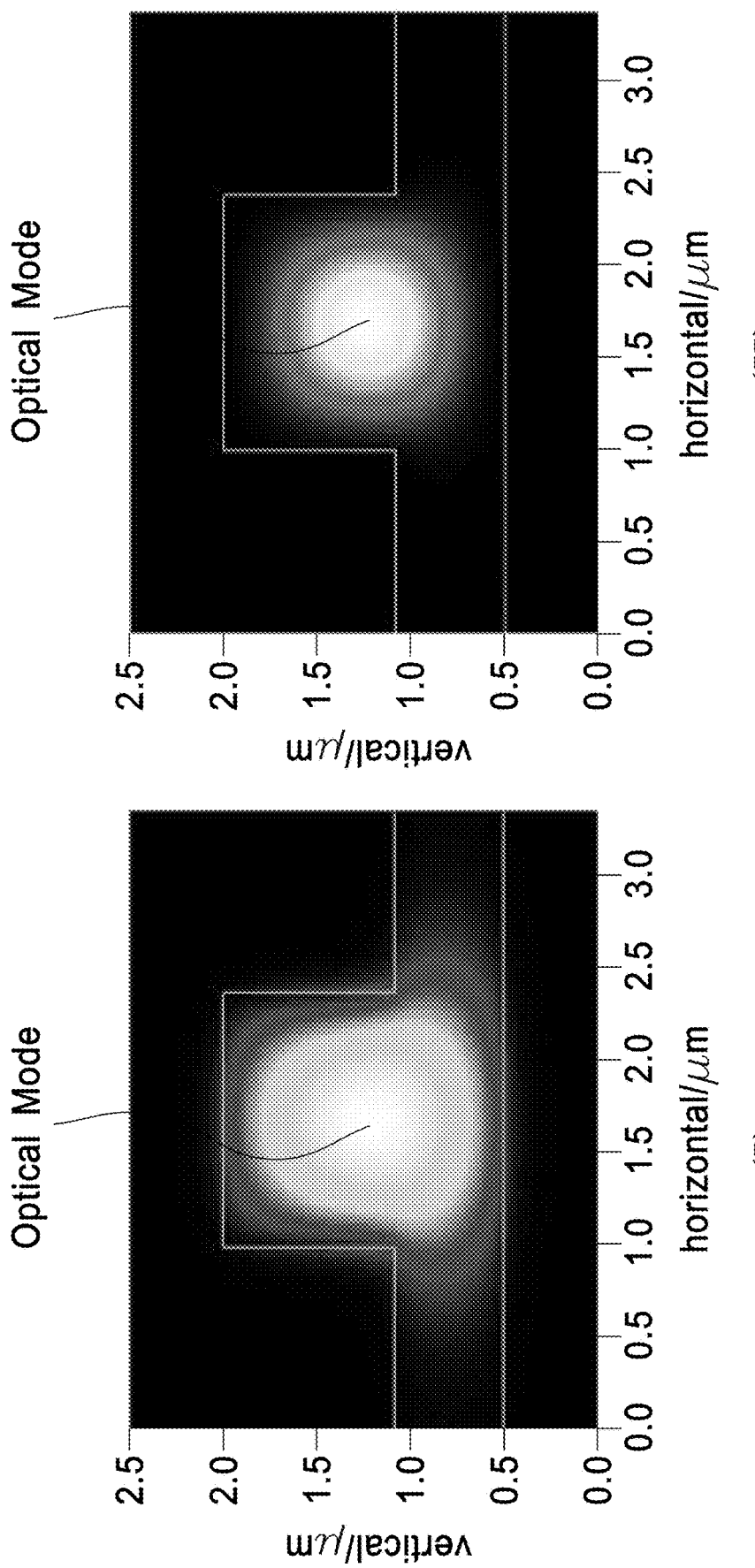
FIG. 5B(I) illustrates leakage of light into slab portion of a rib waveguide, which is more prominent around bends, curves and junctions or interfaces.

FIG. 5B(I) shows how light that is typically confined within the raised portion of the rib waveguide (as shown in FIG. 5B(II)) on the photonics chip 350 may be leaking into the slab portion of the rib waveguide. This leakage happens in the straight portions of the waveguides too, but are especially prominent around bends, curves, junctions and/or any interface. Both the FIGS. 5B(I) and 5B(II) are simulated contours of optical mode in the rib waveguide. The leaky or scattered light can propagate throughout the entire integrated photonic chip 350 and bounce around, which may detrimentally affect performance of the detectors, including the key Sagnac detector 338, if the leaked light gets mixed with the optical signal coming from the waveguide gyro coil. In one embodiment, the raised portion of the rib waveguide may have a height of 0.2-0.5 µm, and the slab portion of the rib waveguide may have a height of 0.2-0.5 µm, making the total height of the rib waveguide in the range of 0.4-1.0 µm. Other dimensions may be used too.

Figure 5C:
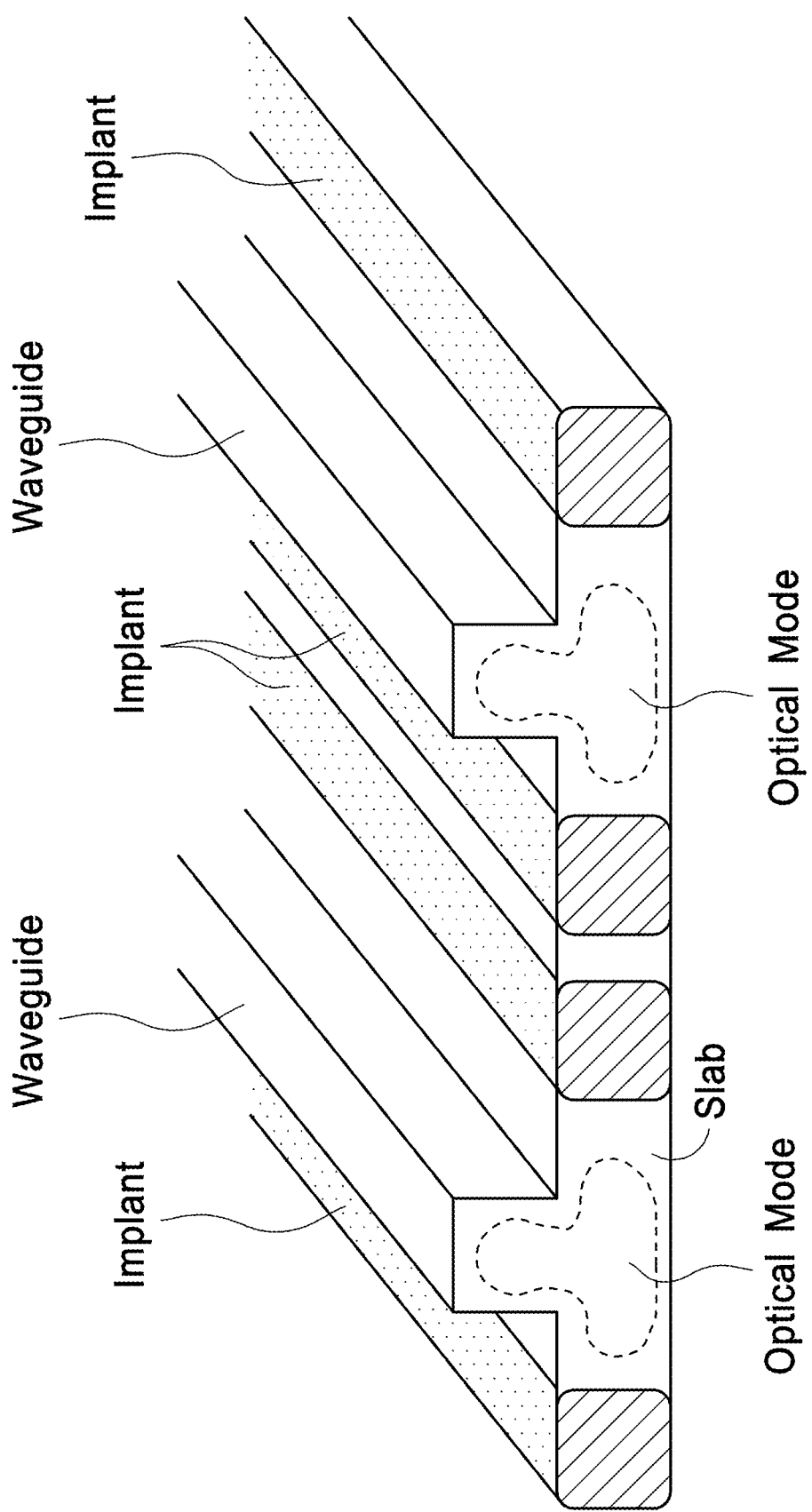
FIG. 5C shows a perspective view of a rib waveguide structure with high dose of implants and absorbers to prevent leakage of light.
Figure 5D:
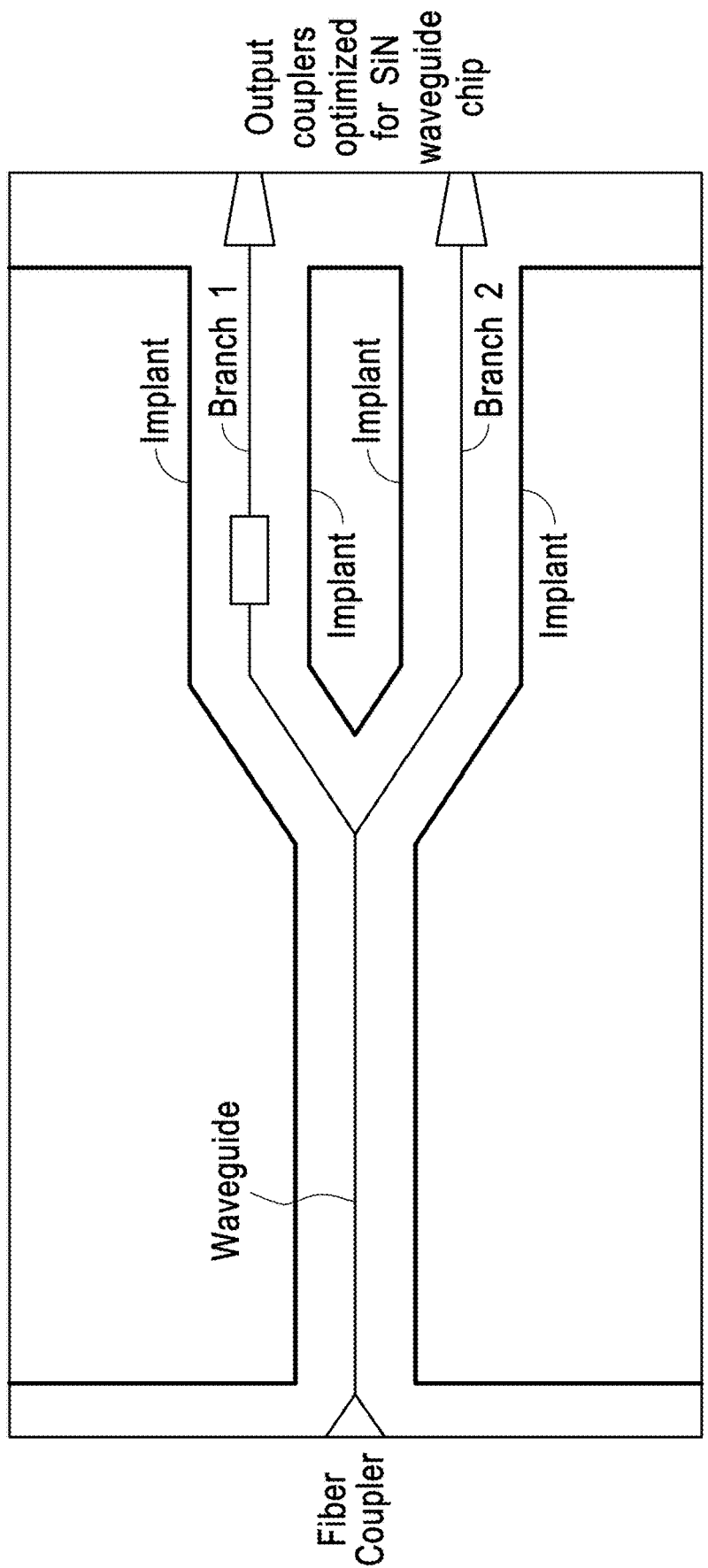
FIG. 5D is a schematic top view of the embodiment shown in FIG. 5A modified with implants all around the waveguides according to the scheme shown in FIG. 5C.

In order to keep the light confined to the waveguide, the inventors use a solution illustrated in FIG. 5C. High dose of implants (e.g., peak concentration of 10^19 dopants per cm$^3$) all the way through the slab around the waveguides absorbs scattered light, so that it does not leak out to other components, including the detectors or adjacent waveguides. As shown in later figures, alternative design for the waveguide is also introduced to confine a specific mode within the waveguide. One alternative design is known as the strip waveguide shown in FIG. 12.

FIG. 5D shows top view of the layout of a chip very similar to the chip shown in FIG. 5A, where implants are shown (in thick lines) around the waveguides including the Y-junctions to reduce crosstalk between the two branches of the Y-splitter and also to block scattered light that may come to the edges of the chip from external sources.

Figure 5E:
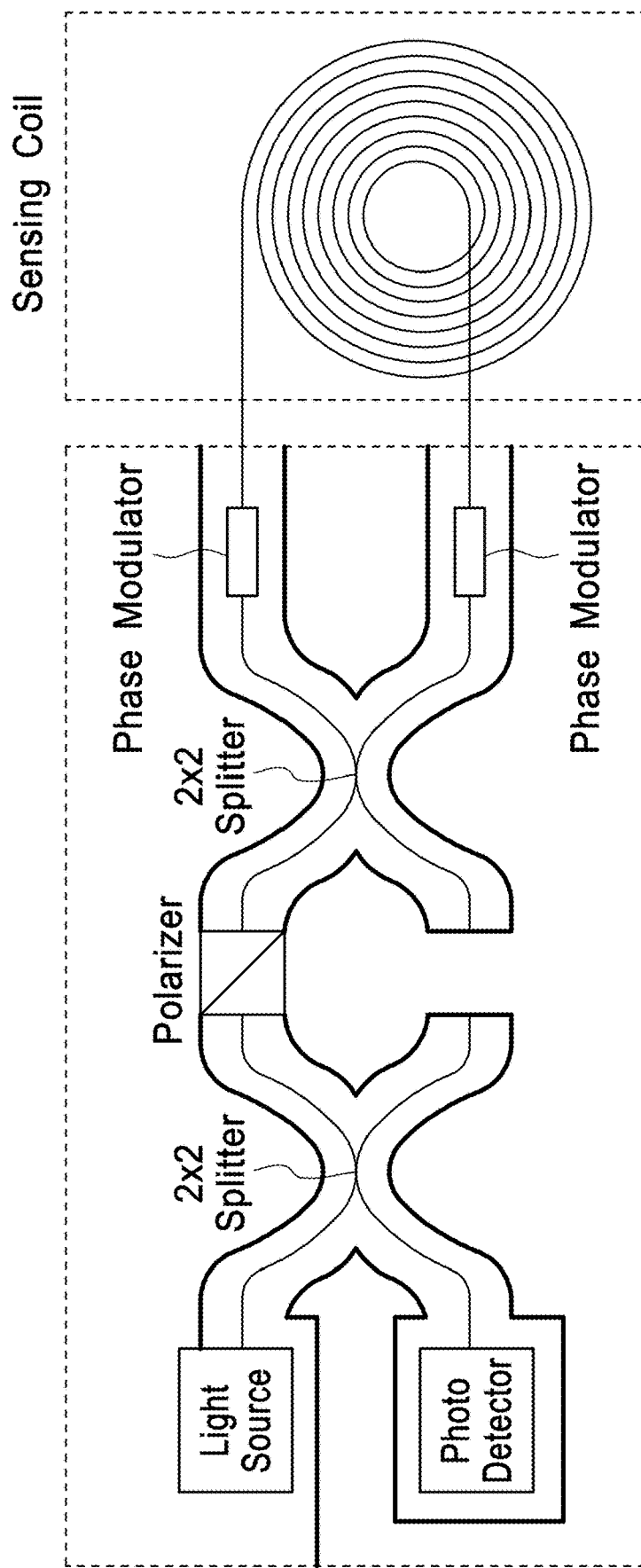
FIG. 5E is a schematic top view of another embodiment of an integrated photonics chip modified with implants all around the waveguides according to the scheme shown in FIG. 5C.

FIG. 5E shows top view of another layout of an integrated photonics optical gyroscope front end with implant (shown as the thick lines) all around the waveguides of the 2×2 splitters (such as splitters shown schematically in FIG. 3A) and around the Sagnac photodetector (such as detector 338 shown schematically in FIG. 3A). FIG. 5E shows a polarizer (such as a polarizer shown in FIG. 4) as an optional component. The need for a polarizer may be eliminated by proper design of the waveguide (e.g., TE polarized waveguide) or use of appropriate mode selective filters in the integrated chip.

Figure 6:
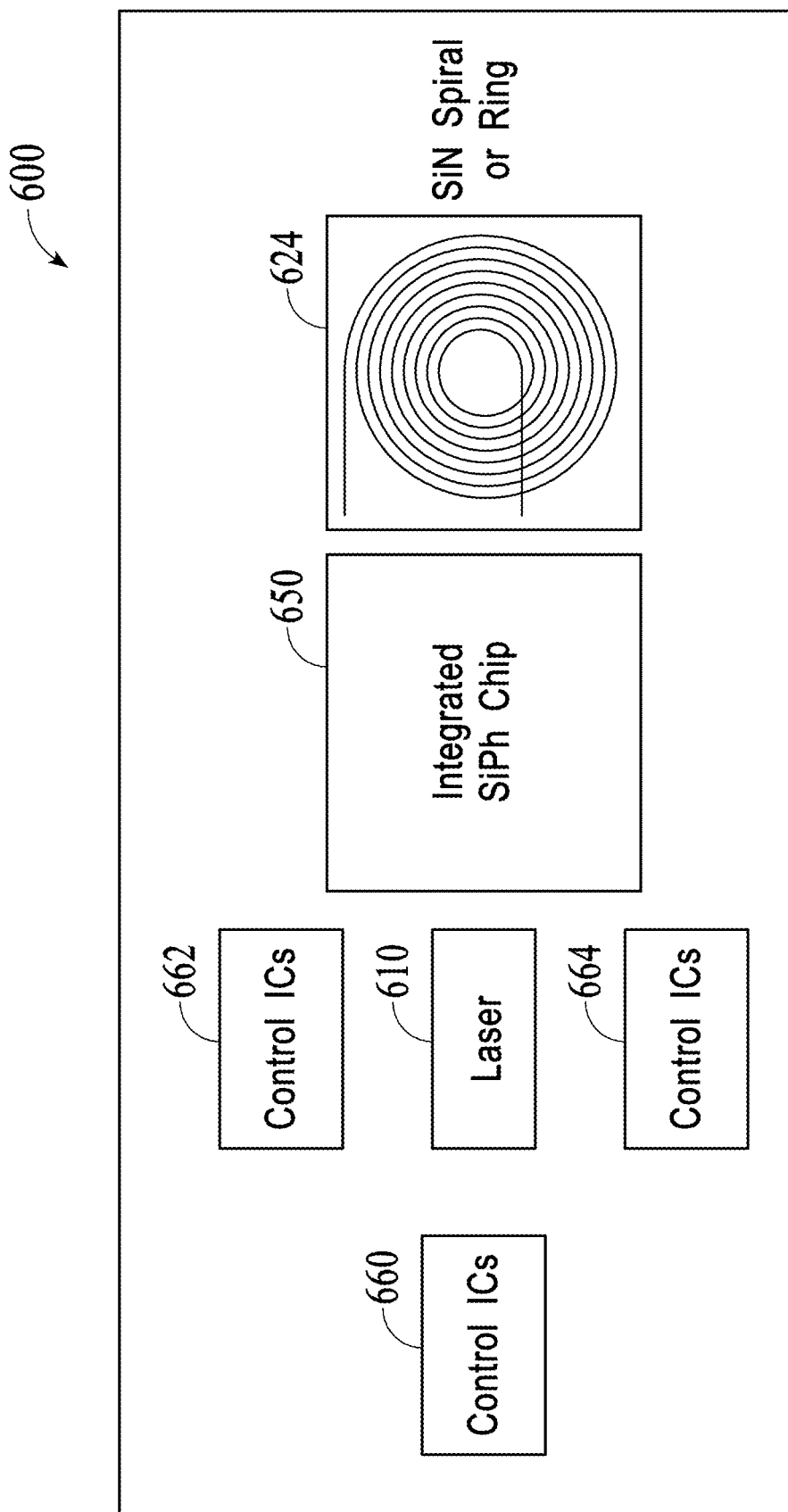
FIG. 6 is schematic of a package housing a laser, various control integrated circuits, an integrated photonics chip and a SiN waveguide-based gyro chip (sensing chip).

FIG. 6 is schematic of a package housing a laser, various integrated circuits for control, an integrated photonics chip and a SiN waveguide chip. The package 600 includes an integrated photonics chip 650 (which may be similar to embodiments shown in FIGS. 3-5), and a SiN waveguide chip 624. The SiN waveguide chip 624 may have a waveguide spiral in one plane, as shown in FIG. 6, where the input and output waveguides intersect, because direction of light cannot change. Alternatively, in order to avoid intersecting waveguides, portions of the waveguide coil or ring may be distributed among a plurality of vertical planes, as described in co-pending U.S. provisional application No. 62/858,588, filed Jun. 7, 2019. The laser source 610 is outside of the integrated photonics chip 650, and possibly fiber-coupled to chip 650 or butt coupled. Discrete control ICs 660, 662, 664 for the laser 610 and/or the chip 650 may be inside the package 600, but not integrated on the same wafer platform. As the degree of integration increases, many of these discrete ICs may be monolithically integrated into the chip 650.

Figure 7:
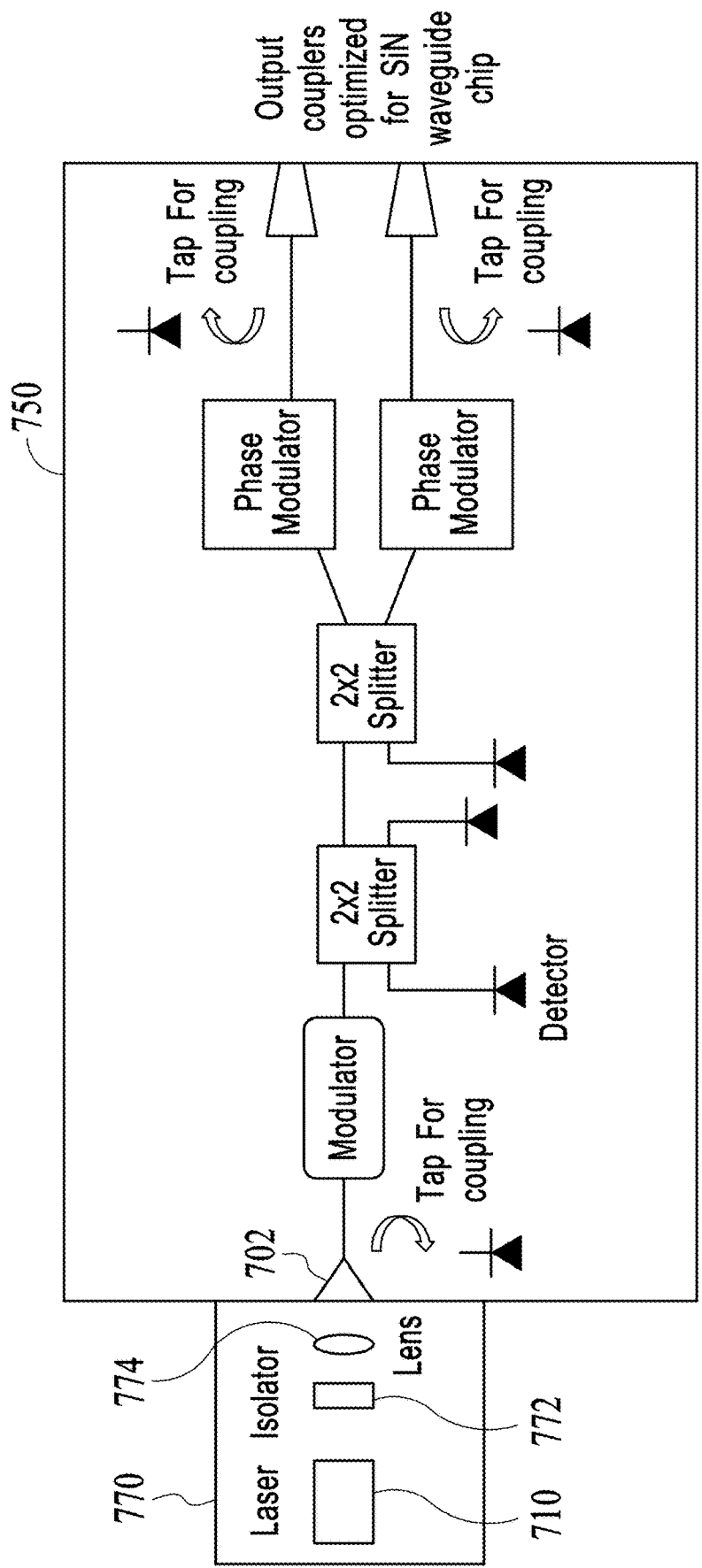
FIG. 7 is schematic of a configuration where a laser is coupled to an integrated photonics chip but not part of the integrated photonics chip.

FIG. 7 is schematic of a configuration where a laser chip 770 is attached to an integrated photonics chip 750 but not part of the integrated photonics chip, i.e. the laser is off-chip. There may be additional components, such as an isolator 772 and a lens 774 (ball lens or other type of suitable lens) hybridly integrated on the laser chip 770. The components on the chip 750 are similar to components shown and described with respect to FIG. 3A, but persons skilled in the art would readily ascertain that other arrangement of system components (e.g., what is shown in FIG. 4 or 5A) are entirely possible. Using a lens to focus the light emitting from the laser 710 may dictate the design of the optical coupler 702 (at input waveguide end) on the chip 750.

Figure 8:
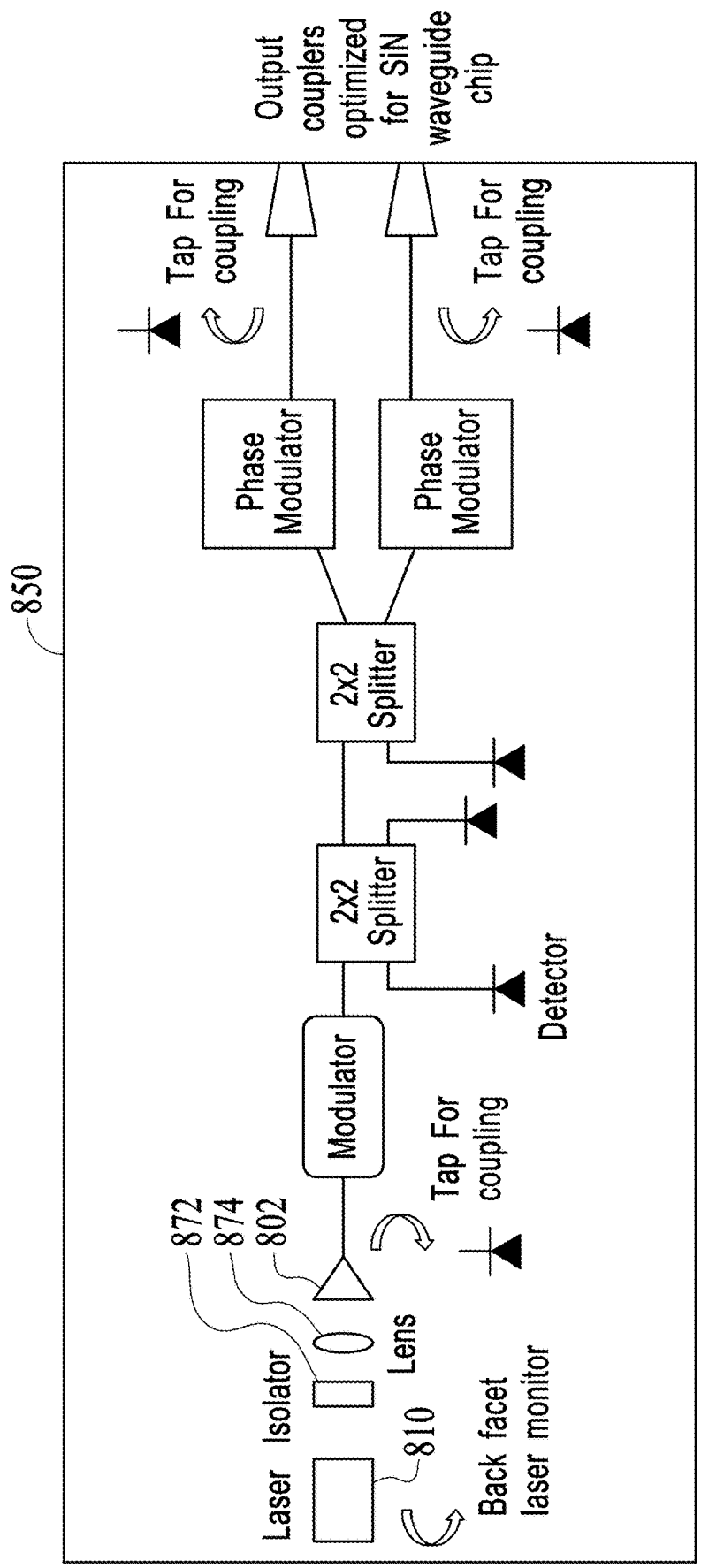
FIG. 8 is schematic of an alternative configuration where a laser is integrated on the integrated photonics chip.

FIG. 8 is schematic of a configuration showing higher degree of on-chip integration, where the laser 810, isolator 872 and a lens 874 are integrated on the integrated photonics chip 850. Using a lens to focus the light emitting from the laser 810 may dictate the design of the optical coupler 802 (at input waveguide end) on the chip 850. Other components in FIG. 8 are identical to the embodiment in FIG. 7. In addition the laser may be bonded using III-V hybrid bonding or grown epitaxial onto silicon.

Figure 9:
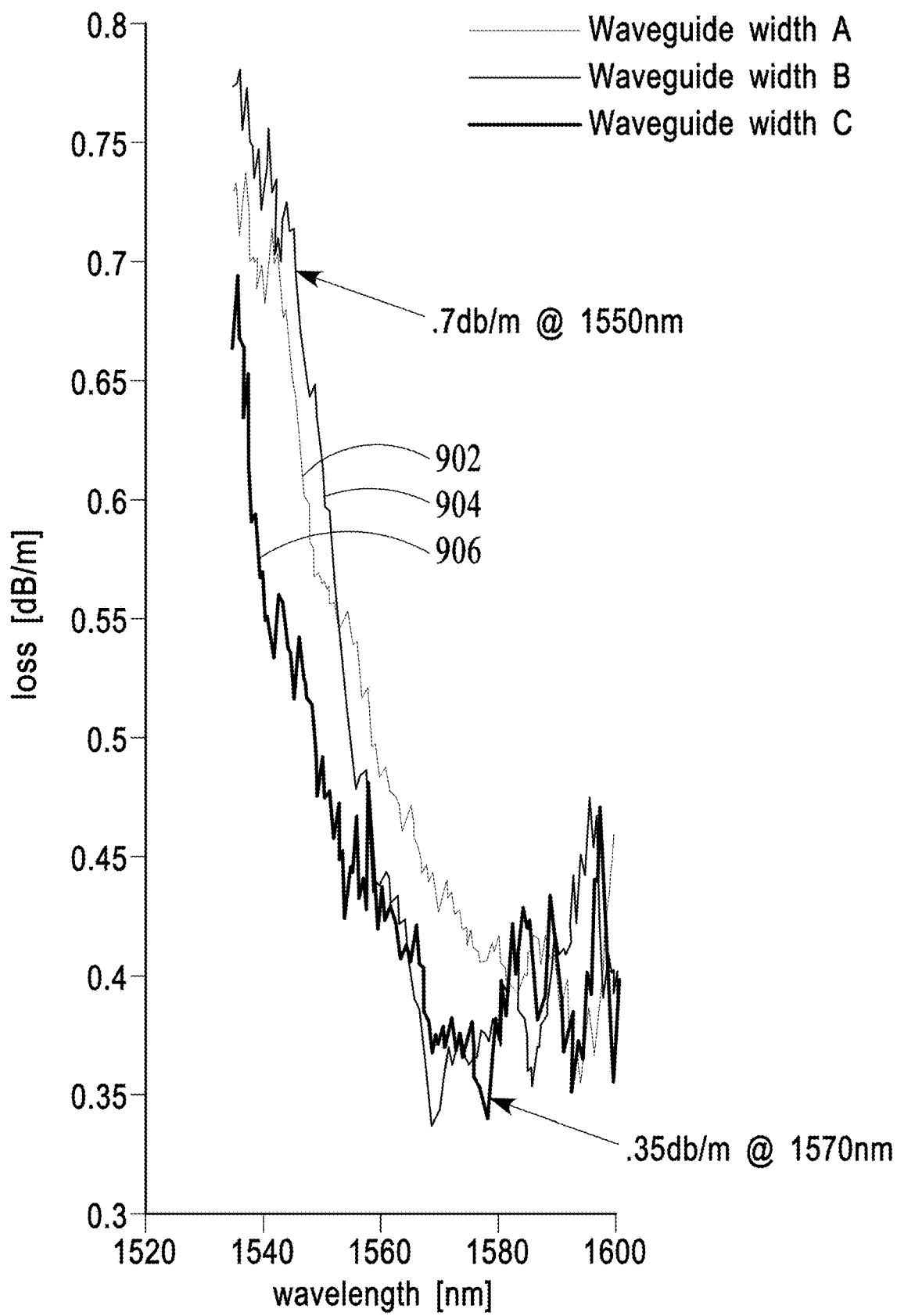
FIG. 9 is a plot showing wavelength dependent loss for different SiN waveguide configurations. The SiN waveguides are strip waveguides.

FIG. 9 is a plot showing wavelength dependent loss for different waveguide configurations. Note that in the overall design of integrated photonics optical gyroscope, the laser source is designed for the wavelength optimum for the waveguide loss. The laser source itself may be broadband and additional components may be used to tune to the desired wavelength. Attenuation in a waveguide is caused by loss of optical signal due to absorption and scattering within the waveguide, as well as radiation loss due to geometric features of the waveguide, such as, microbending and/or sidewall roughness. Scattering and absorption depend on the wavelength of light. In silica-based waveguides containing hydroxyl ions (OH—) impurities, the interaction between vibrating silicon-hydroxyl (Si—OH) bonds and the electromagnetic field of the optical signal causes enhanced absorption at certain harmonic wavelengths. Long-haul fiber optic communication systems utilize 1550 nm as the optimum wavelength for single-mode optical fibers because it is sufficiently away from the enhanced absorption windows and the scattering losses are very low too. However, for integrated photonics optical gyroscope applications, adhering stringently to the 1550 nm wavelength is not a requirement because long-haul optical communication is not an applicable premise here. Rather choosing a wavelength that corresponds to the lowest loss in the SiN waveguide is of importance.

FIG. 9 shows three graphs where measured loss (in dB/m) is plotted against wavelength for three different waveguide configurations: graph 902 for a narrower width waveguide, graph 904 for an intermediate width waveguide and graph 906 for a wider waveguide. As see in FIG. 9, for all three configurations of the waveguide, the loss in the 1550 nm wavelength region is much higher (in the vicinity of 0.7 dB/m) compared to the loss in the 1570-1580 nm wavelength region, where loss is below 0.35 dB/m. With improved waveguide fabrication process (including fine tuning the annealing process to extricate water from the fused silica or oxide), and focus on sidewall smoothing, the loss can be lower than 0.1 dB/m. By selecting the proper laser wavelength one can optimize the signal, lower laser power or improve overall performance of the integrated photonics optical gyroscope. Note that even lower losses have been measured with modified designs and dimensions of the waveguides than what are shown in FIG. 9.

FIG. 10 shows an embodiment 1000 where many components are similar to the design shown in FIG. 3A. However, the key differences with FIG. 3A include using two lasers 1010a and 1010b for doubling the power and/or for redundancy in case one laser malfunctions. Standard commercially available Distributed Feedback (DFB) or Fabry-Perot (FP) lasers may have low power (in the range of 25-50 mW) per laser. So combining lasers helps in harnessing more power with low-cost high-volume-manufactured lasers easily available in the market.

Also, it is possible to use two or more lasers (instead of using one laser) and directly modulate the lasers to spread the linewidth and help with coherency. The modulator 1004 provides random phase noise onto the combined beam from the two or more lasers to smear them to address coherency between the two lasers, and generate an output beam that is equivalent to a broadband light coming from a single source. Two or more lasers thus can be combined to increase the overall power vs one laser with large power. An additional detector may be used to tap the optical signal to monitor the laser signal and power levels.

Figure 11:
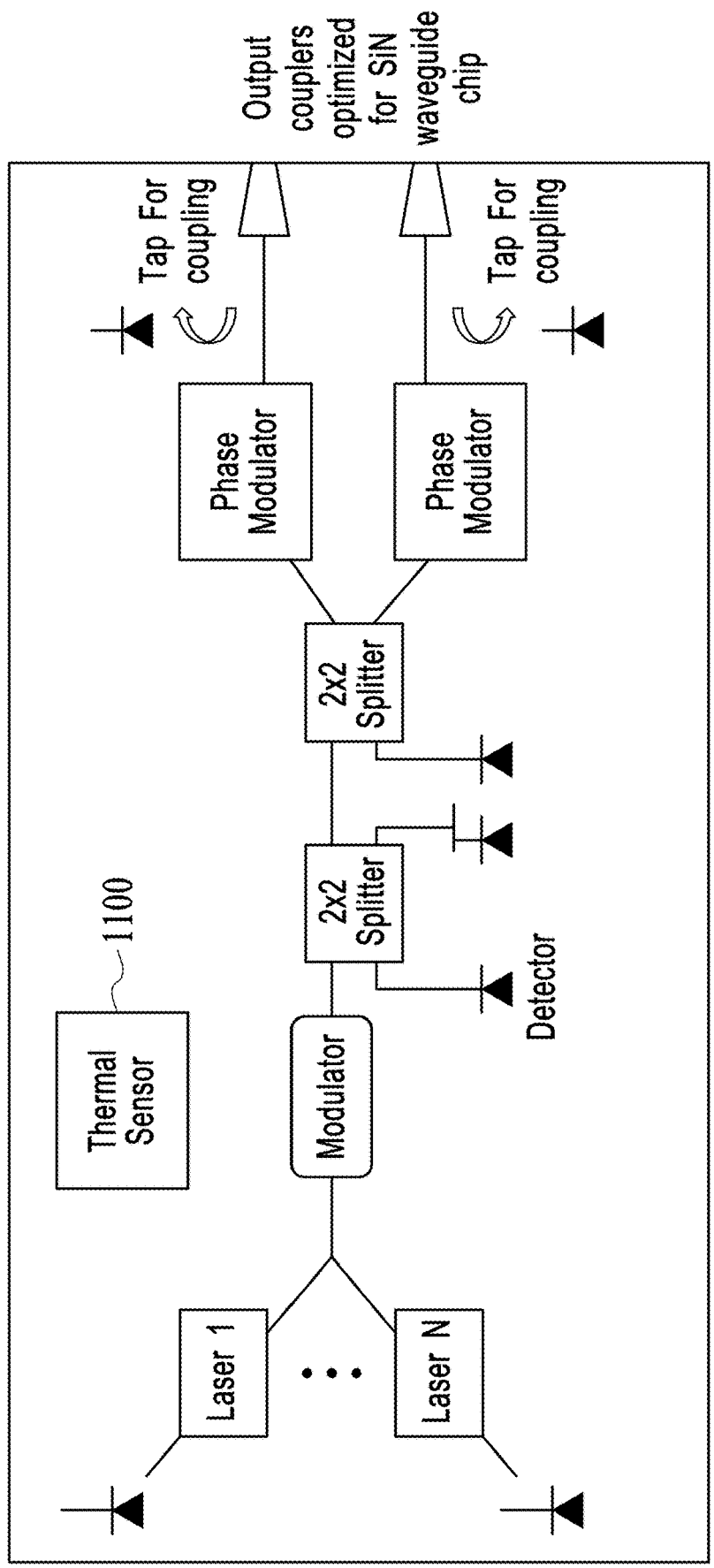
FIG. 11 is a schematic of an integrated photonics chip where optical signals from more than two lasers are combined, and optionally a thermal sensor in integrated on-chip.

FIG. 11 is identical to FIG. 10 with the exception of a series of lasers (1, . . . , N) instead of just two lasers. FIG. 11 also shows that additional components, such as thermal sensor 1100 may be integrated on the integrated photonics chip to monitor whether the chip is operating at a desired temperature range so that the laser performance is not degraded.

Figure 12:
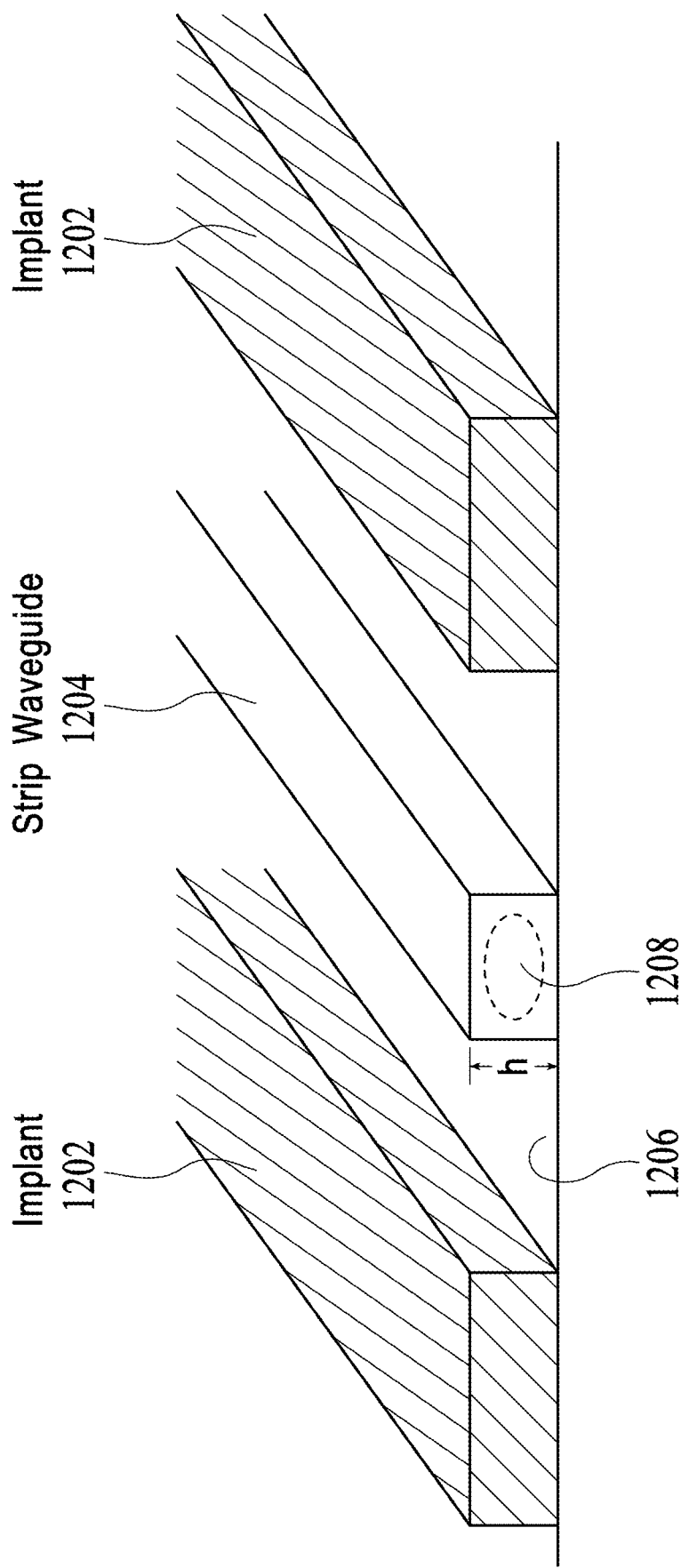
FIG. 12 shows a modified design of waveguide on the integrated photonics chip.

FIG. 12 shows a modified design of waveguide on the integrated photonics chip 350. Instead of rib waveguides shown in FIG. 5B, strip waveguides 1204 are introduced, as strip waveguides are better suited for confining transverse electron (TE) mode than transverse magnetic (TM) mode (i.e. confined optical mode 1208 has predominantly TE component). In an embodiment, a strip waveguide may have a height ('h') of 0.2 µm and a width of 1-2 µm. The major difference between a rib waveguide and a strip waveguide is that there is no slab portion in a strip waveguide, and the waveguide is etched all the way down to the substrate 1206 (e.g. the buried oxide layer on a silicon substrate). Implant regions 1202 may surround the strip waveguides to prevent light leakage and/or to blocking stray light from other components or the chip environment. For example, when TM or TE mode leaks out of a strip waveguide, it is absorbed in the implant region so that it does not reach detectors or other optical components. In addition to making the waveguides inherently TE mode-selective by design, TM filters may be placed at different locations along the optical path on the integrated photonics chip. Note that rib waveguides may have lower loss for both TE and TM, but strip waveguides may be designed in such a way have lower loss for TE while much higher loss for TM. There maybe be also transitions from strip to rib waveguides and vice versa throughout the chip for various optical devices. For example, the phase modulators are typically rib waveguide based devices. Note that the SiN waveguides on the gyro chip are already similar to strip waveguides, as they do not have a slab portion.

FIG. 13 shows some example location of TM filters. Since input light coming from the fiber may have both TE and TM modes, there may be TM filters in between the input coupler 302 and the first 2×2 splitter 306. Each TM filter may constitute a TM filter bank comprising a plurality of individual filters in series. For example, in FIG. 13, each stage 1360 and 1362 of a TM filter may have 1,2,4,6 . . . multi-mode interference (MMI) filters. One or more TM filter 1366 may also be placed before light reaches the key detector (i.e. Sagnac detector 338 shown in previous figures) or at other places throughout the integrated photonics chip as needed to improve performance. For example, a TM filter 1364 may be included to provide the functionality of a polarizer 404 shown in FIG. 4 or the polarizer shown in FIG. 5E). Note that though not shown in FIG. 13, the key detector 338 may be surrounded by implant regions. Note that, in some embodiments, only one branch of the waveguide has a phase modulator (electrical and/or thermal). For example, the phase modulator 322 (shown with dashed line) may be absent altogether or not actively used in certain operational modes, while phase modulator 320 may be actively used to introduce phase difference between the optical beams in the two branches of the output waveguide.

Figure 14:
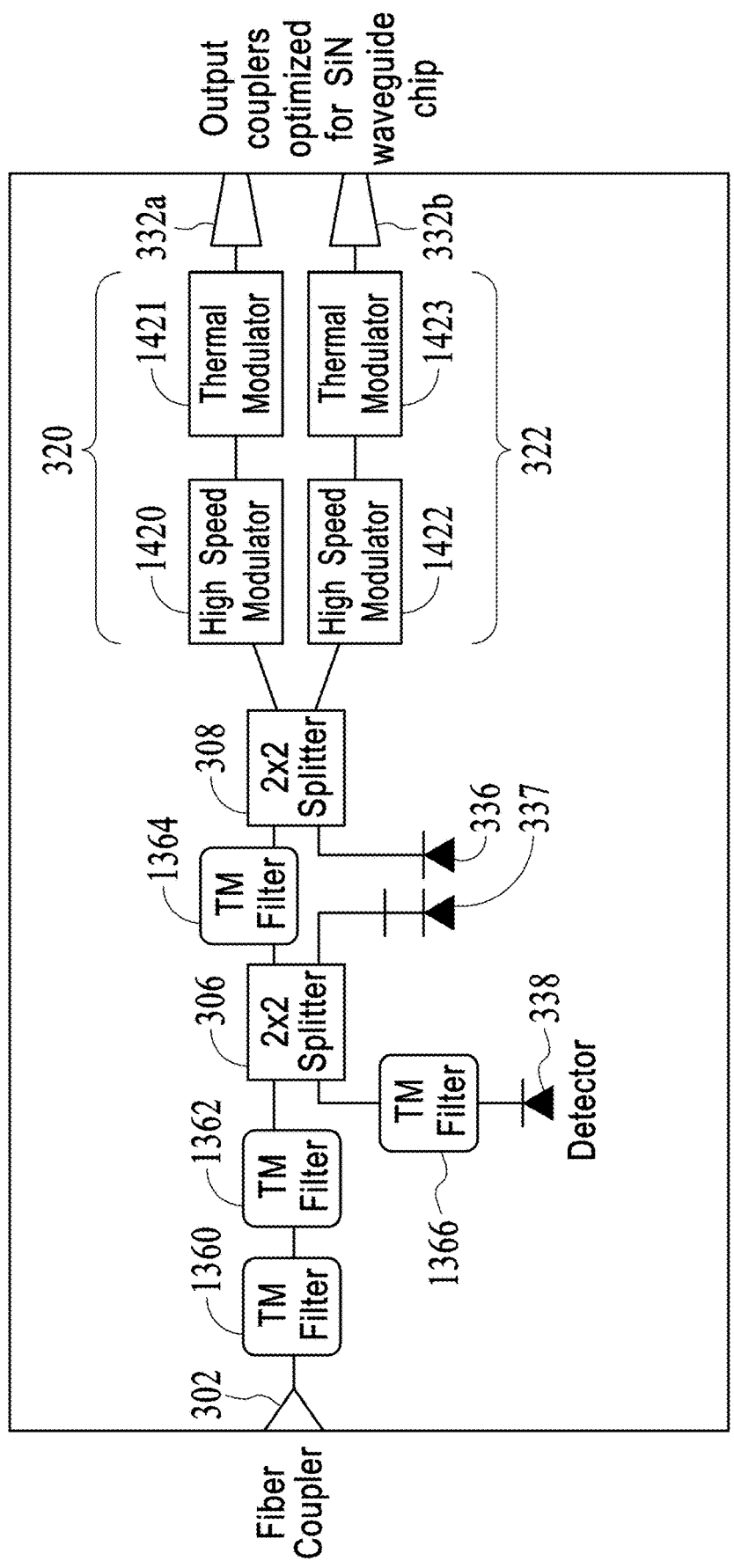
FIG. 14 shows an embodiment similar to the embodiment of FIG. 13, but with the addition of thermal modulators in addition to high-speed electrical modulators for an extra means for phase shifting on the two output waveguide branches.

FIG. 14 shows an embodiment similar to the embodiment of FIG. 13, but with the addition of thermal modulators (1421, 1423) in addition to high-speed electrical modulators (1420, 1422) for an extra means for phase shifting on the two output waveguide branches. The system may have just high speed modulators or just thermal modulator or combination of both on single or both arms.

Figure 15B:
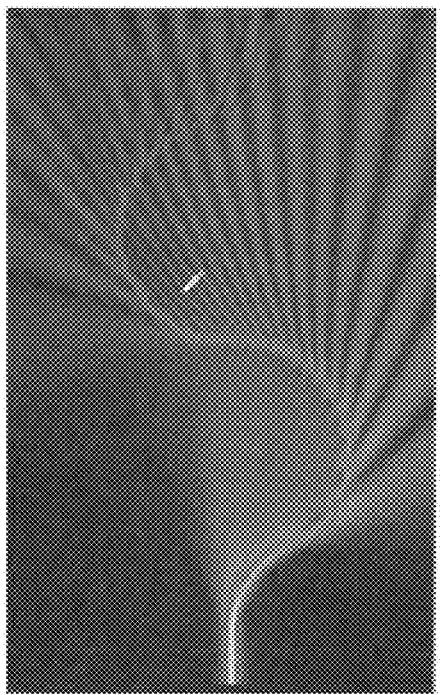
FIGS. 15A and 15B show a serpentine structure that can be used as a TM filter.
Figure 15A:
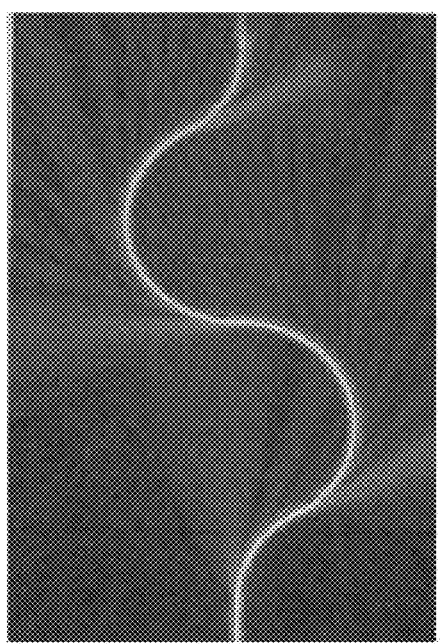

As mentioned above, the TM filters may be based on serpentine structure (S-bends shown in FIGS. 15A-B), or based on MIMI filters. FIGS. 15A and 15B show a serpentine structure that can be used as a TM filter. FIG. 15A show simulated leakage of TE light around the bends of the serpentine structure, and FIG. 15A show simulated leakage of TM light around the bends of the serpentine structure. Since TM leakage is much more prominent, the output of the serpentine structure will have mostly TE light with TM light being filtered out.

Figure 16:
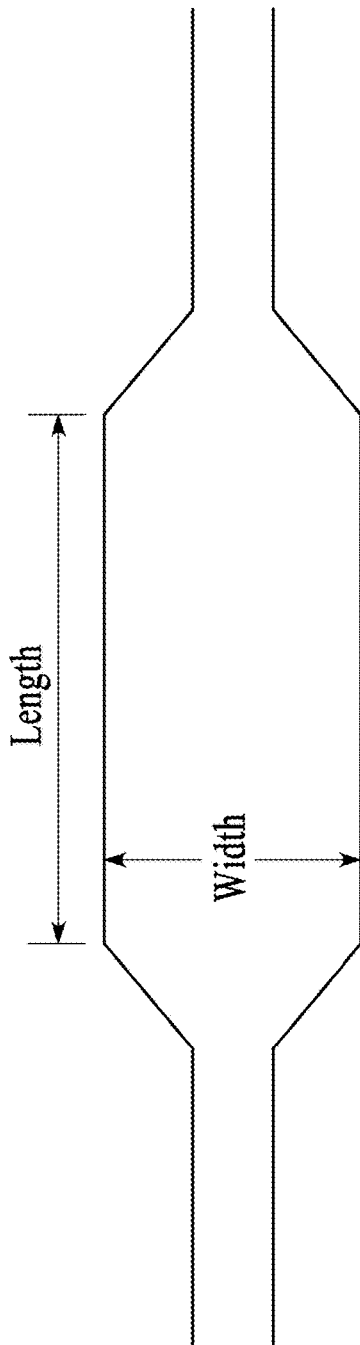
FIG. 16 shows a MMI filter that can be used as a TM filter.

FIG. 16 shows a MMI filter that can be used as a TM filter. Designing proper length and width of the MMI portion, TM mode can be mostly filtered out.

Figure 17:
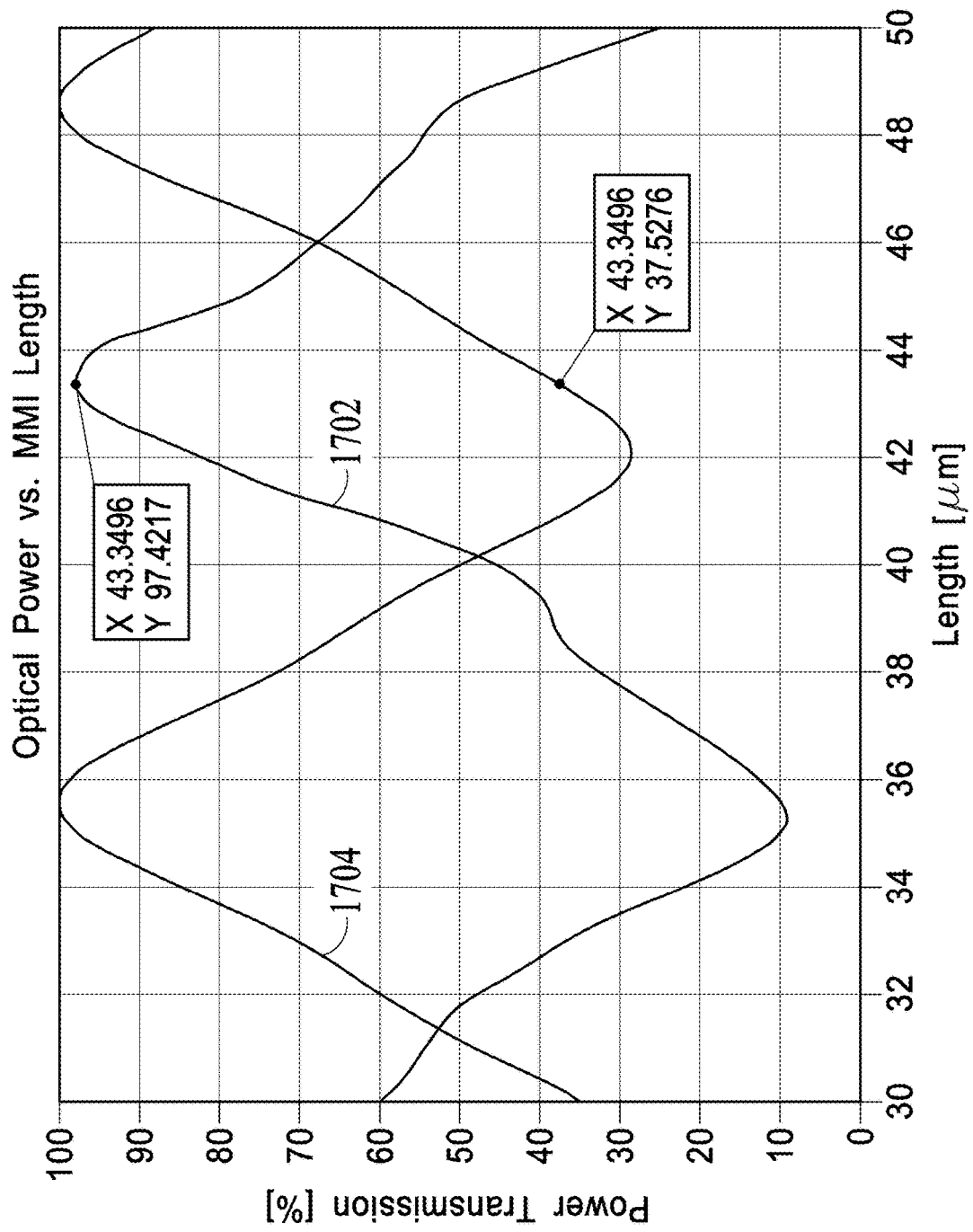
FIG. 17 shows simulated TE/TM power transmission plots for an MMI filter for different lengths.

FIG. 17 shows simulated TE/TM optical power transmission plots for an MMI filter for different lengths. Plot 1702 indicates TE power transmission, and plot 1704 indicates TM power transmission. For example, at a designed length of 43.35 µm, transmission for TE mode is 97.42% and transmission for TE mode is 37.53% for each MMI filter. This translates to a loss for TE mode (LTE) equal to −0.1132 dB per MMI filter, and a loss for TM mode ($L_{TM}$) equal to −4.2560 dB per MMI filter. The extinction ratio (ER) is 4.1425 dB per MIMI filter. Effectiveness of filtering TM out can be achieved by using multiple MMI filters in series (e.g., 2, 4 or more MMI filters).

Figure 18:
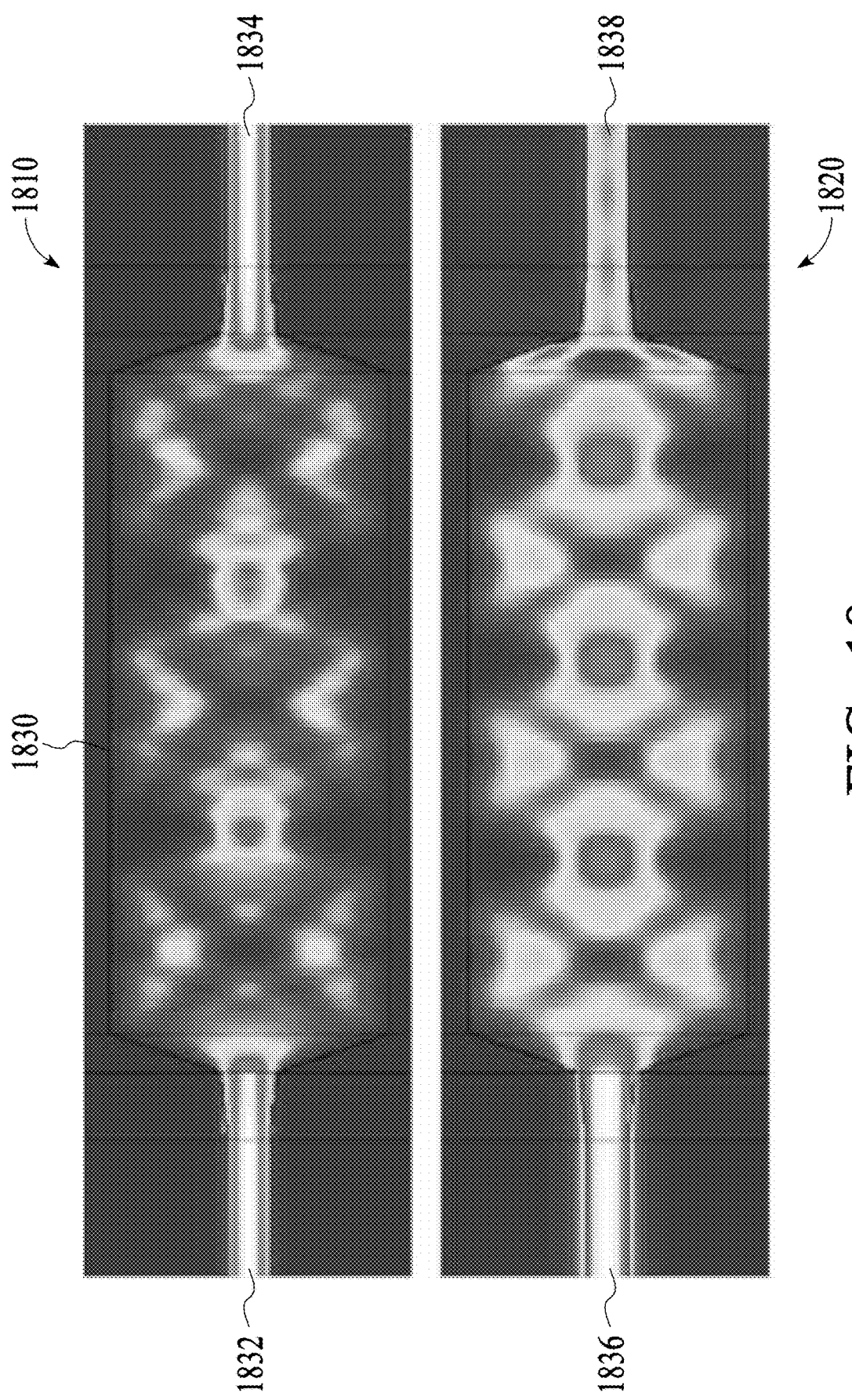
FIG. 18 compares TE/TM optical power transmission simulations for an MMI filter of optimum length and width to effectively filter TM out.

FIG. 18 shows TE/TM optical power transmission simulations for an MMI filter 1830 of optimum length and width to effectively filter TM out. The upper FIG. 1810 shows TE signal transmission and the lower FIG. 1820 shows TM signal transmission. While most of the TE light 1832 coupled at the input end is transmitted through the MMI filter at the output end, TM light 1836 coupled at the input end is partially scattered to the substrate. Hence the need for implants to absorb the scattered light is there (i.e., as shown in FIG. 5c and FIG. 12). FIG. 18 clearly shows that transmitted TE light 1834 at the output end is significantly predominant over transmitted TM light 1838.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense. Additionally, the directional terms, e.g., "top", "bottom" etc. do not restrict the scope of the disclosure to any fixed orientation, but encompasses various permutations and combinations of orientations.

What is claimed is:

1. An integrated photonics-based front-end chip for coupling light into and out of an optical waveguide chip, the front-end chip comprising:
   a light source, wherein the light source comprises one or more semiconductor lasers;
   control electronics for the light source;
   an input coupler that couples the light from the light source into an integrated photonics waveguide structure on the front-end chip that propagates the coupled light in the form of a guided optical beam towards the optical waveguide chip;
   one or more optical mode-selective filters integrated with the integrated photonics waveguide structure to select a preferred optical mode of the guided optical beam;
   at least one optical splitter in a path of the guided optical beam to produce a first branch and a second branch of the guided optical beam;
   a phase modulator that modulates optical phases of the first branch and the second branch of the guided optical beam relative to each other;
   a first output coupler that couples the first branch of the guided optical beam with a first end of a silicon nitride waveguide on the optical waveguide chip;
   a second output coupler that couples the second branch of the guided optical beam with a second end of the silicon nitride waveguide on the optical waveguide chip; and
   an optical detector coupled with the at least one optical splitter, wherein the optical detector receives an optical signal representing an optical phase difference in the return paths of the first branch and second branch of the guided optical beam after traveling within the silicon nitride waveguide on the optical waveguide chip and after being coupled back to the integrated photonics waveguide structure on the front-end chip via the first output coupler and the second output coupler,
   wherein at least some portions of the integrated photonics waveguide structure are surrounded by implant regions disposed at a lateral distance from the photonics waveguide structure to prevent lateral leakage of the guided optical beam whose mode propagates in a planar direction.

2. The front-end chip of claim 1, wherein the light source comprises one or more semiconductor lasers or broadband light sources.

3. The front-end chip of claim 1, wherein a wavelength of the guided optical beam is in infrared range.

4. The front-end chip of claim 2, wherein the control electronics for the light source includes an additional phase modulator.

5. The front-end chip of claim 1, wherein an additional optical phase modulator is inserted before the at least one optical splitter in the path of the guided optical beam, wherein the additional optical phase modulator spreads a linewidth of the light source.

6. The front-end chip of claim 1, wherein the control electronics includes direct frequency modulation circuits for the light source.

7. The front-end chip of claim 1, wherein the integrated photonics waveguide structure on the front-end chip comprises at least one or both of a rib waveguide or a strip waveguide, wherein a rib waveguide comprises a raised portion on top and a slab portion in a bottom adjacent to an oxide layer on a silicon substrate, and a strip waveguide comprises a rectangular cross section etched all the way down to an oxide layer on a substrate.

8. The front-end chip of claim 1, wherein the implant regions block external light.

9. The front-end chip of claim 8, further comprising:
a coupler that couples the at least one optical splitter with the optical detector, wherein the coupler is a part of the integrated photonics waveguide structure on the front-end chip.

10. The front-end chip of claim 8, wherein the optical detector is completely surrounded by the implant regions.

11. The front-end chip of claim 1, wherein the optical detector comprises a p-i-n photodetector or an avalanche photodiode (APD).

12. The front-end chip of claim 1, wherein at least one of the optical mode-selective filters comprises a structure obtained by locally altering the integrated photonics waveguide structure on the front-end chip.

13. The front-end chip of claim 12, wherein at least one of the optical mode-selective filters comprises a multi-mode interference (MMI) filter.

14. The front-end chip of claim 12, wherein at least one of the optical mode-selective filters comprises one or more individual MMI filters in series.

15. The front-end chip of claim 1, wherein at least one of the optical mode-selective filters comprises a serpentine structure with one or more bends from which a non-preferred mode leaks out substantively while the preferred mode propagates.

16. The front-end chip of claim 1, wherein the phase modulator comprises thermal phase modulators or electrical phase modulators.

17. The front-end chip of claim 1, wherein the phase modulator comprises both thermal phase modulators and electrical phase modulators.

18. The front-end chip of claim 1, wherein the phase modulator comprises a first stage of electrical phase modulation followed by a second stage of thermal phase modulation.

19. The front-end chip of claim 1, wherein the phase modulator comprises a first stage of thermal phase modulation followed by a second stage of electrical phase modulation.

20. The front-end chip of claim 1, wherein the phase modulator modulates the optical phase of only one of or both the first branch and the second branch of the guided optical beam.

21. The front-end chip of claim 1, wherein the optical waveguide chip comprises a rotational sensing element for a gyroscope.

22. An integrated photonics-based front-end chip for coupling light into and out of an optical gyroscope component, the front-end chip comprising:

a laser source producing light, wherein the laser source comprises one or more semiconductor lasers;

control electronics for the laser source;

an input coupler that couples the light from the laser source into an integrated photonics waveguide structure that propagates the coupled light in the form of a guided optical beam towards the optical gyroscope component;

one or more optical mode-selective filters integrated with the integrated photonics waveguide structure to select a preferred optical mode of the guided optical beam, wherein the optical mode-selective filters comprise a multi-mode interference (MMI) filter or a serpentine structure with one or more bends from which a non-preferred mode leaks out substantively while the preferred mode propagates;

at least one optical splitter in a path of the guided optical beam to produce a first branch and a second branch of the guided optical beam;

a phase modulator that modulates optical phases of the first branch and the second branch of the guided optical beam relative to each other;

a first output coupler that couples the first branch of the guided optical beam with a first end of a gyroscope waveguide structure on the optical gyroscope component;

a second output coupler that couples the second branch of the guided optical beam with a second end of the gyroscope waveguide structure on the optical gyroscope component; and an optical detector coupled with the at least one optical splitter, wherein the optical detector receives an optical signal representing an optical phase difference in return paths of the first branch and second branch of the guided optical beam after traveling within the gyroscope waveguide structure on the optical gyroscope component and after being coupled back to the integrated photonics waveguide structure via the first output coupler and the second output coupler, wherein at least some portions of the integrated photonics waveguide structure are surrounded by implant regions disposed at a lateral distance from the photonics waveguide structure to prevent lateral leakage of the guided optical beam whose mode propagates in a planar direction.

* * * * *